United States Patent
Kuma et al.

(10) Patent No.: US 6,920,100 B2
(45) Date of Patent: Jul. 19, 2005

(54) OPTICAL DISK APPARATUS PERMITTING HIGH-PRECISION VITERBI DECODING

(75) Inventors: Toshitaka Kuma, Gifu (JP); Hiroshi Watanabe, Gifu (JP)

(73) Assignee: Sanyo Electric Co., Ltd., Moriguchi (JP)

(*) Notice: Subject to any disclaimer, the term of this patent is extended or adjusted under 35 U.S.C. 154(b) by 565 days.

(21) Appl. No.: 10/177,670

(22) Filed: Jun. 24, 2002

(65) Prior Publication Data

US 2003/0002419 A1 Jan. 2, 2003

(30) Foreign Application Priority Data

Jun. 27, 2001 (JP) ........................................ 2001-194819

(51) Int. Cl.[7] .............................................. G11B 5/09
(52) U.S. Cl. ................................ 369/59.21; 369/59.19; 369/124.05
(58) Field of Search .......................... 369/59.21, 59.22, 369/59.17, 59.18, 59.19, 124.05, 124.07, 124.13, 124.15, 53.35, 47.18; 360/39, 40, 45

(56) References Cited

U.S. PATENT DOCUMENTS

| | | | | |
|---|---|---|---|---|
| 5,719,843 A | * | 2/1998 | Nakajima et al. | 369/59.22 |
| 5,796,693 A | * | 8/1998 | Taguchi et al. | 369/59.22 |
| 6,603,722 B1 | * | 8/2003 | Taguchi et al. | 369/59.21 |
| 6,618,338 B1 | * | 9/2003 | Fujiwara et al. | 369/59.22 |
| 6,781,938 B2 | * | 8/2004 | Nanba et al. | 369/59.22 |

FOREIGN PATENT DOCUMENTS

JP 9-320206 12/1997

* cited by examiner

*Primary Examiner*—Thang V. Tran
(74) *Attorney, Agent, or Firm*—Westerman, Hattori, Daniels & Adrian, LLP

(57) ABSTRACT

The optical disk apparatus is provided with a Viterbi decoder and an expected value correction circuit. The branch metric operation unit calculates first, second and third errors between sampling data and expected values, and outputs them to the expected value correction circuit. The expected value correction circuit extracts the sampling data in a region where its variation is small based on the first, second and third errors, calculates the average values of the extracted sampling data to correct the first, second and third expected values, and outputs the corrected expected values to the branch metric operation unit. The Viterbi decoder performs Viterbi decoding of the sampling data based on the first, second and third corrected expected values. Thus, high-precision Viterbi decoding is permitted even if the amplitude value of the reproduction signal varies.

20 Claims, 27 Drawing Sheets

OPTICAL DISK APPARATUS PERMITTING HIGH-PRECISION VITERBI DECODING

BACKGROUND OF THE INVENTION

1. Field of the Invention

The present invention relates to optical disk apparatuses reproducing signals from optical disks, and more particularly to an optical disk apparatus which reproduces signals from an optical disk by accurately converting sampling data of the reproduction signal from multilevel data to binary data even if the reproduction signal varies in amplitude.

2. Description of the Background Art

Recently, with an increase in recording density of digital disks such as magneto-optical disks, optical disks and phase change disks, a partial response (PR) coding method has been widely used which utilizes intersymbol interference by matching transmission signals with transmission path characteristics. Viterbi decoding (maximum likelihood decoding) is known as a decoding method of the PR coding.

In the Viterbi decoding for a conventional optical disk apparatus, a radio frequency (RF) signal being a reproduction signal obtained from an optical disk is sampled, and an error or square error (branch metric) between the sampled digital data and an expected value is calculated. From this square error, an accumulative error (path metric) is calculated for each data stream, and the data stream whose accumulative error is the smallest is selected as the most likely data stream. The RF signal converted to digital data is then converted from multilevel data to binary data.

In the conventional optical disk apparatus, however, in the case where the expected value for use in the Viterbi decoding is fixed to a constant value, the branch metric or the path metric, which is calculated based on the square error between the amplitude of the RF signal and the expected value of the amplitude, would not always allow precise Viterbi decoding, due to variation in amplitude of the RF signal attributable to unevenness in rotation speed, eccentricity or tilt of the digital disk.

Japanese Patent Laying-Open No. 9-320206 discloses a method for performing accurate Viterbi decoding despite such variation in amplitude of the RF signal, wherein a reproduction signal obtained from an optical disk is sampled and, from among the sampled data, a zero-cross sample value located nearest the zero-cross point and values preceding and succeeding the zero-cross sample value are employed as expected values in a Viterbi decoder.

According to the method described in the Japanese Patent Laying-Open No. 9-320206, however, the sampling values in the region where the reproduction signal obtained from the optical disk exhibits largest variation in amplitude have been used as the expected values. This hinders stable setting of the expected values, and as a result, Viterbi decoding cannot be performed with high accuracy.

SUMMARY OF THE INVENTION

Based on the foregoing, an object of the present invention is to provide an optical disk apparatus which ensures accurate Viterbi decoding despite variation in amplitude value of a reproduction signal.

According to the present invention, the optical disk apparatus includes: an optical pickup which irradiates laser light onto an optical disk and detects its reflected light; a sampling circuit which samples a reproduction signal detected by the optical pickup in synchronization with a reference clock and outputs sampling values; an expected value correction circuit which corrects an expected value for use in converting the sampling value from multilevel data to binary data using the sampling values in a region where variation is small; and a Viterbi decoding circuit which converts the sampling value from multilevel data to binary data such that an error between the corrected expected value input from the expected value correction circuit and the sampling value becomes small.

Preferably, the Viterbi decoding circuit calculates an error between the sampling value and an expected value and outputs the error to the expected value correction circuit, and the expected value correction circuit corrects the expected value based on the error to obtain the corrected expected value, and outputs the corrected expected value to the Viterbi decoding circuit.

Preferably, the expected value includes a first expected value greater than a direct-current component of the reproduction signal, a second expected value located in a symmetrical position to the first expected value with respect to the direct-current component of the reproduction signal, and a third expected value equal to the direct-current component of the reproduction signal. The expected value correction circuit corrects the first and second expected values, and outputs, to the Viterbi decoding circuit, a first corrected expected value obtained by correcting the first expected value and a second corrected expected value obtained by correcting the second expected value.

Preferably, the Viterbi decoding circuit calculates a first error between the first expected value and the sampling value, a second error between the second expected value and the sampling value and a third error between the third expected value and the sampling value, and outputs them to the expected value correction circuit. The expected value correction circuit includes: a signal generating circuit which detects a smallest error from among absolute values of the first, second and third errors, and generates, when the detected error is the first error, a first extract signal for extracting the sampling values corresponding to a region where the first error holds a minimal value, and generates, when the detected error is the second error, a second extract signal for extracting the sampling values corresponding to a region where the second error holds a minimal value; an averaging circuit which extracts the sampling values in the region where the variation is small based on the first or second extract signal, and calculates an average value of the extracted sampling values; and an expected value operation circuit which determines the first corrected expected value based on the average value from the averaging circuit and calculates the second corrected expected value based on the first corrected expected value and the third expected value.

Preferably, the signal generating circuit includes: a select signal generating circuit which calculates a difference between the third error at a first timing and the third error at a second timing that is one cycle later than the first timing, and generates an error select signal having an activated level when the difference is smaller than a reference value and having an inactivated level when the difference is greater than the reference value; an absolute value operation circuit which calculates absolute values of the first, second and third errors; a minimal error determination circuit which detects a minimal value from among the three absolute values calculated by the absolute value operation circuit, and generates, when the detected minimal value is the absolute value of the first error, a first error minimal signal having an activated level corresponding to a time period where the first error holds a minimal value, and generates, when the detected minimal value is the absolute value of the second error, a second error minimal signal having an activated level corresponding to a time period where the second error holds a minimal value; and an AND gate which carries out logical AND of the first or second error minimal signal and the error select signal to generate the first or second extract signal. The averaging circuit latches the third error in synchronization with an activated level of the first or second extract signal, and calculates an average of the average value of the third error at the first timing and the third error at the second timing.

Preferably, the Viterbi decoding circuit calculates a first error between the first expected value and the sampling value, a second error between the second expected value and the sampling value, and a third error between the third expected value and the sampling value, and outputs them to the expected value correction circuit. The expected value correction circuit includes: a signal generating circuit which detects a smallest error from among absolute values of the first, second and third errors, and generates, when the detected error is the first error, a first extract signal for extracting the sampling values corresponding to a central portion of a region where the first error holds a minimal value, and generates, when the detected error is the second error, a second extract signal for extracting the sampling values corresponding to a central portion of a region where the second error holds a minimal value; an averaging circuit which extracts the sampling values based on the first or second extract signal and calculates an average value of the extracted sampling values; and an expected value operation circuit which determines the first corrected expected value based on the average value from the averaging circuit, and calculates the second corrected expected value based on the first corrected expected value and the third expected value.

Preferably, the signal generating circuit includes: an absolute value operation circuit which calculates absolute values of the first, second and third errors; a minimal error determination circuit which detects a minimal value from among the three absolute values calculated by the absolute value operation circuit and generates, when the detected minimal value is the absolute value of the first error, a first error minimal signal having an activated level corresponding to a time period where the first error holds a minimal value, and generates, when the detected minimal value is the absolute value of the second error, a second error minimal signal having an activated level corresponding to a time period where the second error holds a minimal value; and an AND gate which carries out logical AND of the first error minimal signal, a first delayed error minimal signal having the first error minimal signal delayed by a prescribed amount of the reference clock and a second delayed error minimal signal having the first delayed error minimal signal delayed by the prescribed amount to generate the first extract signal, and carries out logical AND of the second error minimal signal, a third delayed error minimal signal having the second error minimal signal delayed by the prescribed amount of the reference clock and a fourth delayed error minimal signal having the third delayed error minimal signal delayed by the prescribed amount to generate the second extract signal. The averaging circuit latches the third error in synchronization with an activated level of the first or second extract signal, and calculates an average of the average value of the third error at the first timing and the third error at the second timing.

Preferably, the Viterbi decoding circuit calculates a first error between the first expected value and the sampling value, a second error between the second expected value and the sampling value, and a third error between the third expected value and the sampling value, and outputs them to the expected value correction circuit. The expected value correction circuit includes: a signal generating circuit which detects a smallest error from among the first, second and third errors, and generates, when the detected error is the first error, a first extract signal for extracting the first errors, and generates, when the detected error is the second error, a second extract signal for extracting the second errors; an averaging circuit which extracts the first or second errors based on the first or second extract signal, and calculates an average value of the extracted errors; and an expected value operation circuit which determines the first or second corrected expected value based on a reference expected value added with the average value of the errors.

Preferably, the signal generating circuit includes: a minimal error determination circuit which detects a minimal value from among the first, second and third errors and generates, when the detected minimal value is the first error, a first error minimal signal having an activated level corresponding to a time period where the first error holds a minimal value and a first select signal for selecting the first error, and generates, when the detected minimal value is the second error, a second error minimal signal having an activated level corresponding to a time period where the second error holds a minimal value and a second select signal for selecting the second error; a select circuit which selects the first or second error based on the first and second select signals; a select signal generating circuit which receives the error selected by the select circuit and calculates a difference between the error at the first timing and the error at the second timing, and generates an error select signal having an activated level when the difference is smaller than a reference value and having an inactivated level when the difference is greater than the reference value; and an AND gate which carries out logical AND between the first or second error minimal signal and the error select signal to generate the first or second extract signal. The averaging circuit latches the error selected by the select circuit in a time period where the first or second extract signal is at an activated level, and calculates an average of the average value of the error at the first timing and the error at the second timing.

Preferably, the Viterbi decoding circuit calculates a first error between the first expected value and the sampling value, a second error between the second expected value and the sampling value and a third error between the third expected value and the sampling value, and outputs them to the expected value correction circuit. The expected value correction circuit includes: a signal generating circuit which detects a smallest error from among the first, second and third errors and generates, when the detected error is the first error, a first extract signal for extracting a central portion of a region where the first error holds a minimal value, and generates, when the detected error is the second error, a second extract signal for extracting a central portion of a region where the second error holds a minimal value; an averaging circuit which extracts the first or second errors corresponding to the central portion based on the first or second extract signal and calculates an average value of the extracted errors; and an expected value operation circuit which determines the first or second corrected expected value based on a reference expected value added with the average value of the errors.

Preferably, the signal generating circuit includes: a minimal error determination circuit which detects a minimal value from among the first, second and third errors and generates, when the detected minimal value is the first error, a first error minimal signal having an activated level corresponding to a time period where the first error holds a minimal value, and generates, when the detected minimal value is the second error, a second error minimal signal having an activated level corresponding to a time period where the second error holds a minimal value; and an AND gate which carries out logical AND of the first error minimal signal, a first delayed error minimal signal having the first error minimal signal delayed by a prescribed amount of the reference clock and a second delayed error minimal signal having the first delayed error minimal signal delayed by the prescribed amount to generate the first extract signal, and carries out logical AND of the second error minimal signal, a third delayed error minimal signal having the second error minimal signal delayed by the prescribed amount of the reference clock and a fourth delayed error minimal signal having the third delayed error minimal signal delayed by the prescribed amount to generate the second extract signal. The averaging circuit latches the first or second error in synchronization with an activated level of the first or second extract signal, and calculates an average of the average value of the first or second error at the first timing and the first or second error at the second timing.

Preferably, the expected value includes a first expected value greater than a direct-current component of the reproduction signal, a second expected value located in a symmetrical position to the first expected value with respect to the direct-current component of the reproduction signal, and a third expected value equal to the direct-current component of the reproduction signal, and the expected value correction circuit corrects the first, second and third expected values and outputs, to the Viterbi decoding circuit, a first corrected expected value obtained by correcting the first expected value, a second corrected expected value obtained by correcting the second expected value, and a third corrected expected value obtained by correcting the third expected value.

Preferably, the Viterbi decoding circuit calculates a first error between the first expected value and the sampling value, a second error between the second expected value and the sampling value and a third error between the third expected value and the sampling value, and outputs them to the expected value correction circuit. The expected value correction circuit includes: a signal generating circuit which detects a smallest error from among absolute values of the first, second and third errors and generates, when the detected error is the first error, a first extract signal for extracting the third errors in a region where the first error holds a minimal value, generates, when the detected error is the second error, a second extract signal for extracting the third errors in a region where the second error holds a minimal value, and generates, when the detected error is the third error, a third extract signal for extracting the smallest third errors; a first averaging circuit which extracts the third errors based on the first extract signal and calculates an average value of the extracted errors; a second averaging circuit which extracts the third errors based on the second extract signal and calculates an average value of the extracted errors; a third averaging circuit which extracts the third errors based on the third extract signal and calculates an average value of the extracted errors; and an expected value operation circuit which determines the first corrected expected value based on a first error average value output from the first averaging circuit, determines the second corrected expected value based on a second error average value output from the second averaging circuit, and determines the third corrected expected value based on a third error average value output from the third averaging circuit.

Preferably, the signal generating circuit includes: a select signal generating circuit which calculates a difference between the third error at the first timing and the third error at the second timing, and generates an error select signal having an activated level when the difference is smaller than a reference value and having an inactivated level when the difference is greater than the reference value; an absolute value operation circuit which calculates absolute values of the first, second and third errors; a minimal error determination circuit which detects a minimal value from among the three absolute values calculated by the absolute value operation circuit and generates, when the detected minimal value is the absolute value of the first error, a first error minimal signal having an activated level corresponding to a time period where the first error holds a minimal value, generates, when the detected minimal value is the absolute value of the second error, a second error minimal signal having an activated level corresponding to a time period where the second error holds a minimal value, and generates, when the detected minimal value is the absolute value of the third error, a third error minimal signal having an activated level corresponding to a time period where the third error holds a minimal value; a first AND gate which carries out logical AND of the first error minimal signal and the error select signal to generate the first extract signal; a second AND gate which carries out logical AND of the second error minimal signal and the error select signal to generate the second extract signal; and a third AND gate which carries out logical AND of the third error minimal signal and the error select signal to generate the third extract signal. The first averaging circuit latches the third error in synchronization with an activated level of the first extract signal, and calculates an average of the average value of the third error at the first timing and the third error at the second timing. The second averaging circuit latches the third error in synchronization with an activated level of the second extract signal, and calculates an average of the average value of the third error at the first timing and the third error at the second timing. The third averaging circuit latches the third error in synchronization with an activated level of the third extract signal, and calculates an average of the average value of the third error at the first timing and the third error at the second timing.

Preferably, the Viterbi decoding circuit calculates a first error between the first expected value and the sampling value, a second error between the second expected value and the sampling value, and a third error between the third expected value and the sampling value, and outputs them to the expected value correction circuit. The expected value correction circuit includes: a signal generating circuit which detects a smallest error from among absolute values of the first, second and third errors and generates, when the detected error is the first error, a first extract signal for extracting a central portion of a region where the first error holds a minimal value, generates, when the detected error is the second error, a second extract signal for extracting a central portion of a region where the second error holds a minimal value, and generates, when the detected error is the third error, a third extract signal for extracting a central portion of a region where the third error holds a minimal value; a first averaging circuit which extracts the third errors corresponding to the central portion based on the first extract signal and calculates an average value of the extracted errors; a second averaging circuit which extracts the third errors corresponding to the central portion based on the second extract signal and calculates an average value of the extracted errors; a third averaging circuit which extracts the third errors corresponding to the central portion based on the third extract signal and calculates an average value of the extracted errors; and an expected value operation circuit which determines the first corrected expected value based on a first error average value output from the first averaging circuit, determines the second corrected expected value based on a second error average value output from the second averaging circuit, and determines the third corrected expected value based on a third error average value output from the third averaging circuit.

Preferably, the signal generating circuit includes: an absolute value operation circuit which calculates absolute values of the first, second and third errors; a minimal error determination circuit which detects a minimal value from the three absolute values calculated by the absolute value operation circuit and generates, when the detected minimal value is the absolute value of the first error, a first error minimal signal having an activated level corresponding to a time period where the first error holds a minimal value, generates, when the detected minimal value is the absolute value of the second error, a second error minimal signal having an activated level corresponding to a time period where the second error holds a minimal value, and generates, when the detected minimal value is the absolute value of the third error, a third error minimal signal having an activated level corresponding to a time period where the third error holds a minimal value; a first AND gate which carries out logical AND of the first error minimal signal, a first delayed error minimal signal having the first error minimal signal delayed by a prescribed amount of the reference clock and a second delayed error minimal signal having the first delayed error minimal signal delayed by the prescribed amount, to generate the first extract signal; a second AND gate which carries out logical AND of the second error minimal signal, a third delayed error minimal signal having the second error minimal signal delayed by the prescribed amount of the reference clock and a fourth delayed error minimal signal having the third delayed error minimal signal delayed by the prescribed amount, to generate the second extract signal; and a third AND gate which carries out logical AND of the third error minimal signal, a fifth delayed error minimal signal having the third error minimal signal delayed by the prescribed amount of the reference clock and a sixth delayed error minimal signal having the fifth delayed error minimal signal delayed by the prescribed amount, to generate the third extract signal. The first averaging circuit latches the third error in synchronization with an activated level of the first extract signal, and calculates an average of the average value of the third error at the first timing and the third error at the second timing. The second averaging circuit latches the third error in synchronization with an activated level of the second extract signal, and calculates an average of the average value of the third error at the first timing and the third error at the second timing. The third averaging circuit latches the third error in synchronization with an activated level of the third extract signal, and calculates an average of the average value of the third error at the first timing and the third error at the second timing.

Preferably, the Viterbi decoding circuit calculates a first error between the first expected value and the sampling value, a second error between the second expected value and the sampling value and a third error between the third expected value and the sampling value, and outputs them to the expected value correction circuit. The expected value correction circuit includes: a signal generating circuit which detects a smallest error from among absolute values of the first, second and third errors and generates, when the detected error is the first error, a first extract signal for extracting the first errors, generates, when the detected error is the second error, a second extract signal for extracting the second errors, and generates, when the detected error is the third error, a third extract signal for extracting the third errors; a first averaging circuit which extracts the first errors based on the first extract signal and calculates an average value of the extracted errors; a second averaging circuit which extracts the second errors based on the second extract signal and calculates an average value of the extracted errors; a third averaging circuit which extracts the third errors based on the third extract signal and calculates an average value of the extracted errors; and an expected value operation circuit which determines the first corrected expected value based on a first reference expected value added with a first error average value output from the first averaging circuit, determines the second corrected expected value based on a second reference expected value added with a second error average value output from the second averaging circuit, and determines the third corrected expected value based on a third reference expected value added with a third error average value output from the third averaging circuit.

Preferably, the signal generating circuit includes: a minimal error determination circuit which detects a minimal value from among the first, second and third errors and generates, when the detected minimal value is the first error, a first error minimal signal having an activated level corresponding to a time period where the first error holds a minimal value and a first select signal for selecting the first error, generates, when the detected minimal value is the second error, a second error minimal signal having an activated level corresponding to a time period where the second error holds a minimal value and a second select signal for selecting the second error, and generates, when the detected minimal value is the third error, a third error minimal signal having an activated level corresponding to a time period where the third error holds a minimal value and a third select signal for selecting the third error; a select circuit which selects the first, second and third errors based on the first, second and third select signals, respectively; a select signal generating circuit which receives the error selected by the select circuit and calculates a difference between the error at the first timing and the error at the second timing, and generates an error select signal having an activated level when the difference is smaller than a reference value and having an inactivated level when the difference is greater than the reference value; a first AND gate which carries out logical AND of the first error minimal signal and the error select signal to generate the first extract signal; a second AND gate which carries out logical AND of the second error minimal signal and the error select signal to generate the second extract signal; and a third AND gate which carries out logical AND of the third error minimal signal and the error select signal to generate the third extract signal. The first averaging circuit latches the first error in synchronization with an activated level of the first extract signal, and calculates an average of the average value of the first error at the first timing and the first error at the second timing to output the first error average value. The second averaging circuit latches the second error in synchronization with an activated level of the second extract signal, and calculates an average of the average value of the second error at the first timing and the second error at the second timing to output the second error average value. The third averaging circuit latches the third error in synchronization with an activated level of the third extract signal, and calculates an average of the average value of the third error at the first timing and the third error at the second timing to output the third error average value.

Preferably, the Viterbi decoding circuit calculates a first error between the first expected value and the sampling value, a second error between the second expected value and the sampling value and a third error between the third expected value and the sampling value, and outputs them to the expected value correction circuit. The expected value correction circuit includes: a signal generating circuit which detects a smallest error from among absolute values of the first, second and third errors and generates, when the detected error is the first error, a first extract signal for extracting a central portion of a region where the first error holds a minimal value, generates, when the detected error is the second error, a second extract signal for extracting a central portion of a region where the second error holds a minimal value, and generates, when the detected error is the third error, a third extract signal for extracting a central portion of a region where the third error holds a minimal value; a first averaging circuit which extracts the first errors corresponding to the central portion based on the first extract signal and calculates an average value of the extracted errors; a second averaging circuit which extracts the second errors corresponding to the central portion based on the second extract signal and calculates an average value of the extracted errors; a third averaging circuit which extracts the third errors corresponding to the central portion based on the third extract signal and calculates an average value of the extracted errors; and an expected value operation circuit which determines the first corrected expected value based on a first reference expected value added with a first error average value output from the first averaging circuit, determines the second corrected expected value based on a second reference expected value added with a second error average value output from the second averaging circuit, and determines the third corrected expected value based on a third reference expected value added with a third error average value output from the third averaging circuit.

Preferably, the signal generating circuit includes: a minimal error determination circuit which detects a minimal value from among the first, second and third errors and generates, when the detected minimal value is the first error, a first error minimal signal having an activated level corresponding to a time period where the first error holds a minimal value, generates, when the detected minimal value is the second error, a second error minimal signal having an activated level corresponding to a time period where the second error holds a minimal value, and generates, when the detected minimal value is the third error, a third error minimal signal having an activated level corresponding to a time period where the third error holds a minimal value; a first AND gate which carries out logical AND of the first error minimal signal, a first delayed error minimal signal having the first error minimal signal delayed by a prescribed amount of the reference clock and a second delayed error minimal signal having the first delayed error minimal signal delayed by the prescribed amount to generate the first extract signal; a second AND gate which carries out logical AND of the second error minimal signal, a third delayed error minimal signal having the second error minimal signal delayed by the prescribed amount of the reference clock and a fourth delayed error minimal signal having the third delayed error minimal signal delayed by the prescribed amount to generate the second extract signal; and a third AND gate which carries out logical AND of the third error minimal signal, a fifth delayed error minimal signal having the third error minimal signal delayed by the prescribed amount of the reference clock and a sixth delayed error minimal signal having the fifth delayed error minimal signal delayed by the prescribed amount to generate the third extract signal. The first averaging circuit latches the first error in synchronization with an activated level of the first extract signal, and calculates an average of the average value of the first error at the first timing and the first error at the second timing to output the first error averaging value. The second averaging circuit latches the second error in synchronization with an activated level of the second extract signal, and calculates an average of the average value of the second error at the first timing and the second error at the second timing to output the second error average value. The third averaging circuit latches the third error in synchronization with an activated level of the third extract signal, and calculates an average of the average value of the third error at the first timing and the third error at the second timing to output the third error average value.

In the optical disk apparatus according to the present invention, sampling values are detected from a reproduction signal obtained from an optical disk. Expected values for use in converting the sampling value from multilevel data to binary data are corrected based on the sampling values obtained in a region where variation is small. The sampling value is then converted from multilevel data to binary data by Viterbi decoding, using the corrected expected values. As such, according to the present invention, the Viterbi decoding is performed accurately even if the reproduction signal varies in amplitude, and as a result, accurate signal reproduction from the optical disk is ensured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
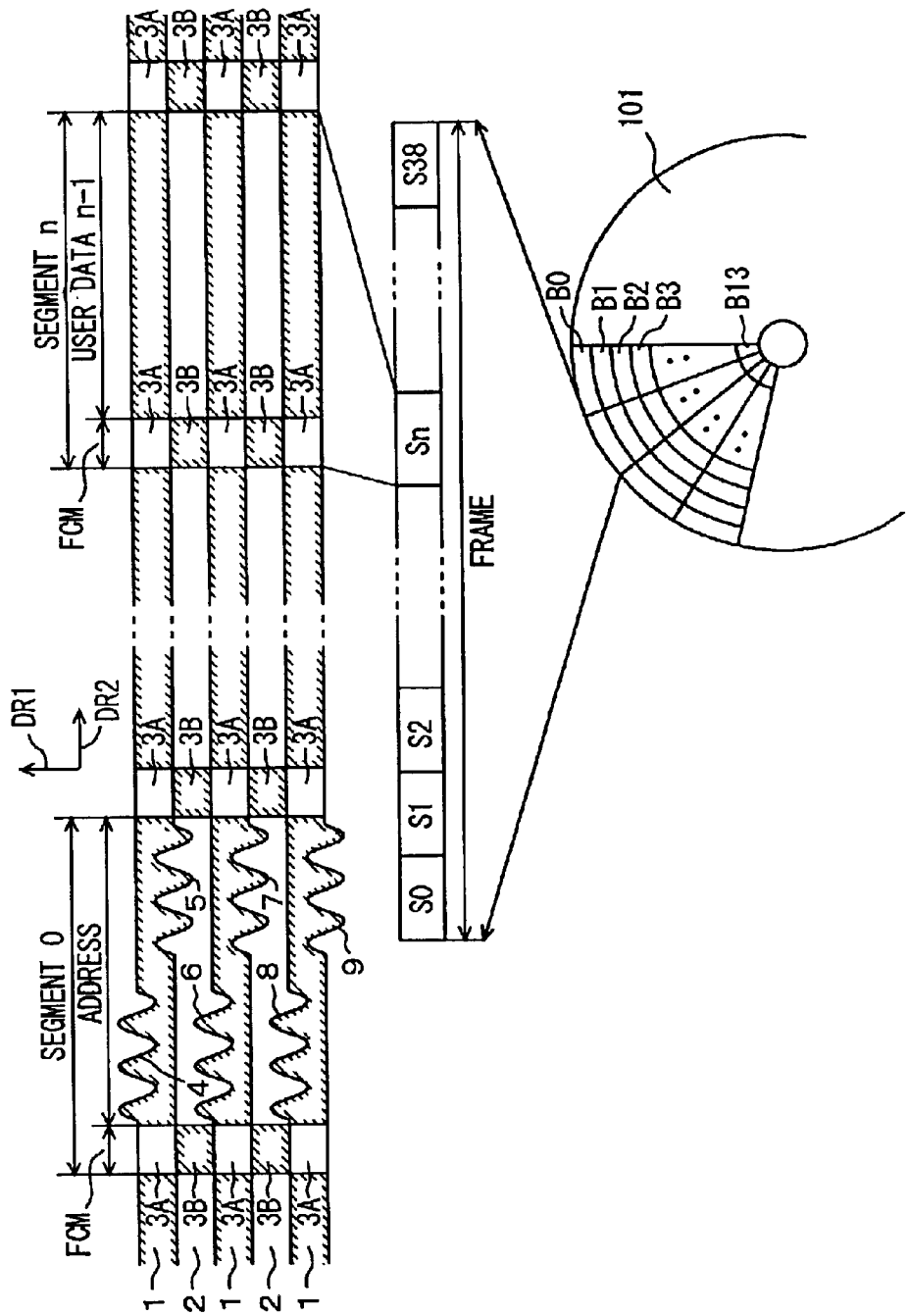
FIG. 1 is a top plan view showing a magneto-optical disk and its format.

Hereinafter, embodiments of the present invention will be described in detail with reference to the accompanying drawings. In the drawings, like or corresponding portions are denoted by like reference characters, and description thereof will not be repeated.

First Embodiment

Referring to FIG. 1, a magneto-optical disk from which signals are to be reproduced by an optical disk apparatus of the present invention is described. The magneto-optical disk 101 includes a plurality of bands B0–B13 arranged concentrically in a radial direction.

Grooves 1 and lands 2 are alternately arranged in a radial direction DR1 of magneto-optical disk 101. Groove 1 includes a land 3A on the order of 4 μm in a tangential direction DR2 of magneto-optical disk 101. Land 2 includes a groove 3B of about 4 μm in the tangential direction DR2. Land 3A and groove 3B are formed adjacent to each other in the radial direction DR1 of magneto-optical disk 101, and they are formed at regular intervals in the tangential direction DR2.

Land 3A and groove 3B are called "fine clock marks" and serve as the basis for generation of a reference clock CLK for use in recording signals on and/or reproducing signals from magneto-optical disk 101. Grooves 1 and lands 2 are arranged spirally or concentrically.

Each band B0–B13 includes a plurality of frames for signals to be recorded and/or reproduced in units of frames. More specifically, magneto-optical disk 101 has frames as units of recording arranged at regular intervals, with each frame being formed of 39 segments S0, S1, S2, . . . , S38.

Each segment has a length of 532 DCB (Data Channel Bits). At the head of each segment, fine clock marks (FCM) 3A, 3B are formed which indicate phase information of the clock for data recording and reproduction. In the segment S0 at the head of the frame, fine clock marks 3A, 3B are followed by address information indicating an address on magneto-optical disk 101, which is pre-formatted by wobbles 4–9 at the time of manufacture of magneto-optical disk 101.

Wobbles 4 and 5, wobbles 6 and 7, and wobbles 8 and 9 are formed on the opposite walls of grooves 1, and store the same address information. Such an address information recording method is called a one-sided stagger method, which enables accurate detection of the address information even if magneto-optical disk 101 suffers tilt or the like and laser light deflects from the center of groove 1 or land 2 in the radial direction DR1.

The region where the address information is stored and the region where fine clock marks 3A, 3B are formed are not used as the region for recording user data. A segment Sn is formed of fine clock marks 3A, 3B and user data n-1.

Figure 2:
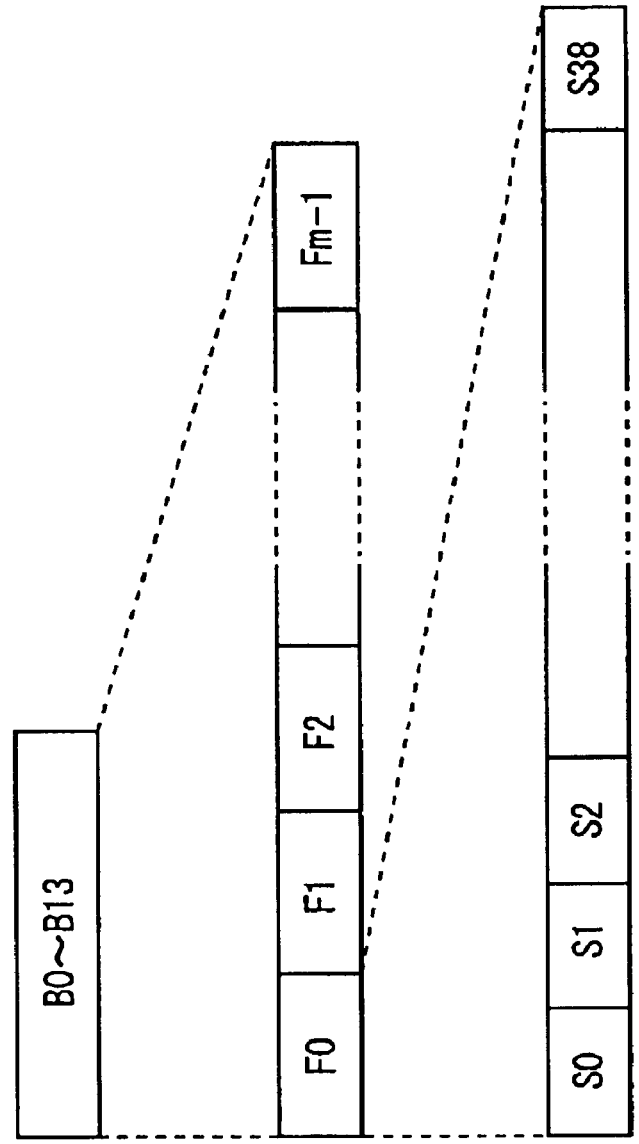
FIG. 2 illustrates relation between bands, frames and segments.

Referring to FIG. 2, each band B0–B13 consists of m frames F0 to Fm-1. The number of frames differs for each band B0–B13. One frame consists of 39 segments S0–S38, as described above. Signals are recorded on and/or reproduced from magneto-optical disk 101 in accordance with the data format as shown in FIG. 2.

Figure 3:
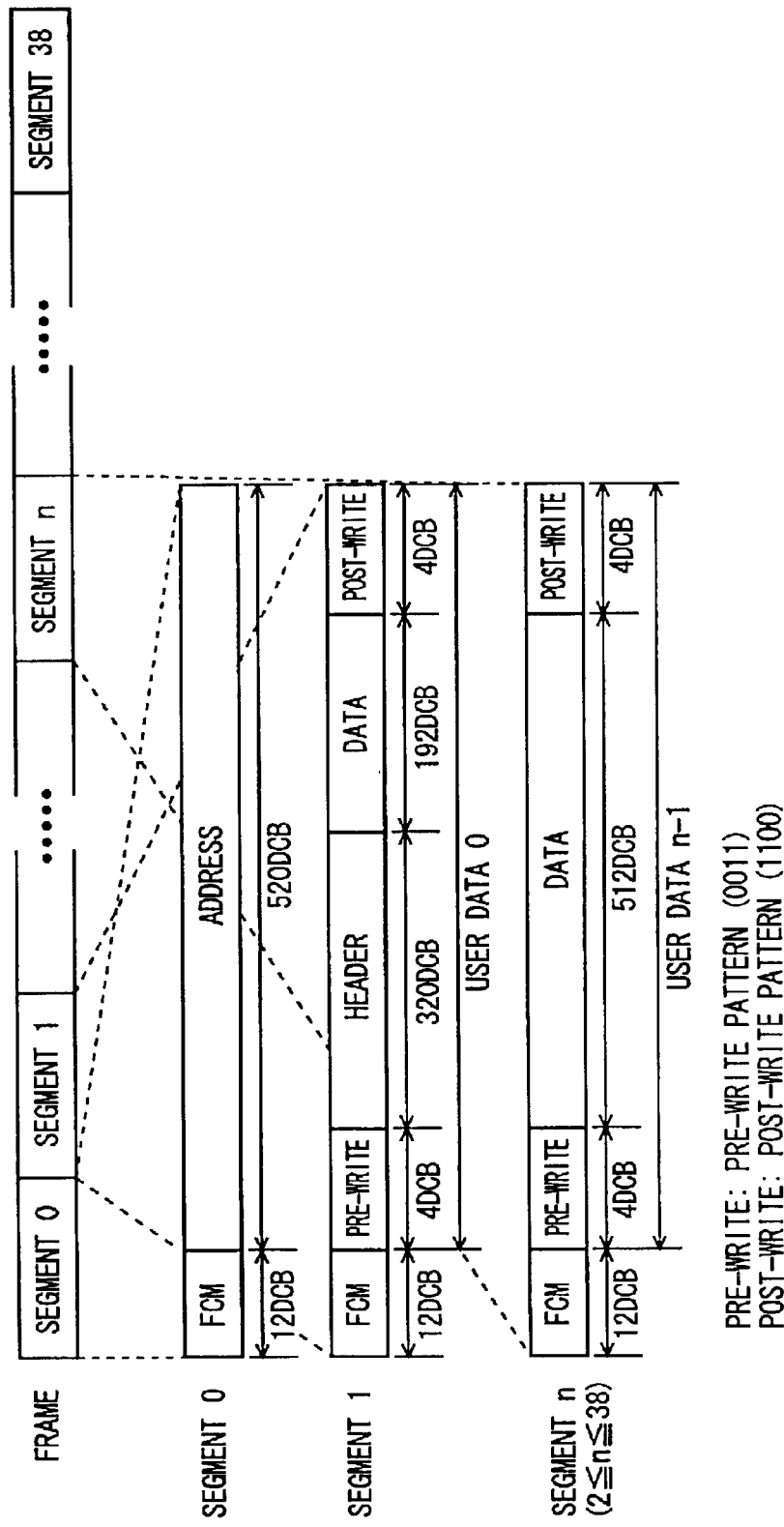
FIG. 3 schematically shows a format of a recorded data stream.

Referring to FIG. 3, detailed configurations of the segments are described. Of the segments S0, S1, S2, . . . , S38 constituting a frame, segment S0 is an address segment pre-formatted on magneto-optical disk 101, and segments S1–S38 are data segments secured as the user data recording regions. Segment S0 consists of a fine clock mark region FCM of 12 DCB and an address of 520 DCB. Segment S1 consists of fine clock mark region FCM of 12 DCB, pre-write of 4 DCB, data of 512 DCB, and post-write of 4 DCB.

The pre-write indicates the beginning of data, which is formed of a prescribed pattern of "0011", for example. The post-write indicates the end of the data and is formed of a prescribed pattern of, e.g., "1100".

The user data region of segment S1 includes a header having a fixed pattern for use in position confirmation of data at the time of reproduction, position compensation of a reproduction clock, and others. The fixed pattern on the header has its direct-current component restricted, on which a prescribed number of domains of 2T formed at intervals of 2T and a prescribed number of 8T domains formed at 8T intervals, for example, are recorded.

The phase compensation is performed by adjusting the sampling timing of the analog signal obtained by reproducing the 2T domain to match the phase of the reproduction clock obtained by delaying the phase of the reference clock for use in signal recording. The position confirmation of a signal at the time of reproduction is performed by reproducing the 8T domain and confirming whether the position of the digital signal obtained by binarizing the reproduction signal matches a predicted position of the digital signal of the 8T domain. Still further, respective patterns of the pre-write, post-write and header are recorded together with user data at the time of recording of the user data.

Segments S2–S38 each consist of fine clock mark region FCM of 12 DCB, pre-write of 4 DCB, data of 512 DCB, and post-write of 4 DCB.

Figure 4:
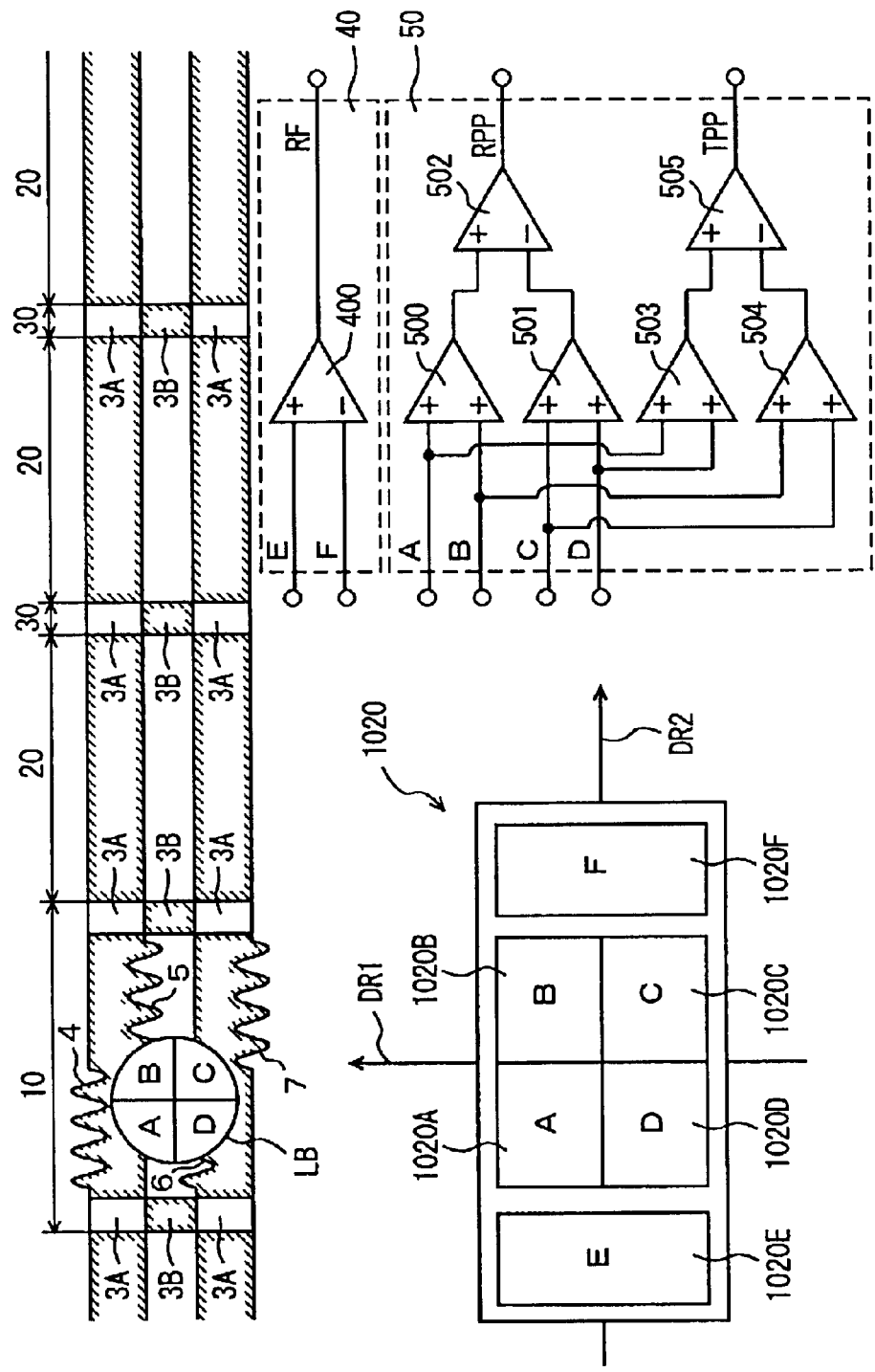
FIG. 4 illustrates data reproduction from a pre-format region and a user data region.

Referring to FIG. 4, detection of an address signal RPP, a fine clock mark signal TPP, and a magneto-optical signal RF from magneto-optical disk 101 is now described. Regions 10 and 30 constitute pre-format regions which are pre-formatted during the manufacture of magneto-optical disk 101. Wobbles 4–7 are formed in region 10, and fine clock marks 3A, 3B are formed in region 30. A region 20 constitutes a user data region where user data is recorded.

An optical pickup 102 irradiates laser light onto magneto-optical disk 101 and detects reflected light thereof. It includes a photodetector 1020 having six detecting regions 1020A, 1020B, 1020C, 1020D, 1020E, and 1020F. The region "A" 1020A and the region "B" 1020B, the region "C" 1020C and the region "D" 1020D, and the region "E" 1020E and the region "F" 1020F are arranged in the tangential direction DR2 of magneto-optical disk 101. Region "A" 1020A and region "D" 1020D, and region "B" 1020B and region "C" 1020C are arranged in the radial direction DR1 of magneto-optical disk 101.

Region "A" 1020A, region "B" 1020B, region "C" 1020C and region "D" 1020D detect laser light LB irradiated onto magneto-optical disk 101 and reflected at the A region, B region, C region and D region, respectively. Region "E" 1020E and region "F" 1020F detect the laser light LB reflected at the A, B, C and D regions as a whole and diffracted to two directions different in plane of polarization by a Wollaston prism (not shown) of optical pickup 102.

Reproduction signal RF of the magneto-optical signal recorded on region 20 being the user data region is detected by calculating a difference between laser light intensity [E] detected at region "E" 1020E and laser light intensity [F] detected at region "F" 1020F of photodetector 1020. More specifically, a subtracter 400 included in a circuit 40 calculates the difference between laser light intensity [E] detected at region "E" 1020E and laser light intensity [F] detected at region "F" 1020F and outputs the reproduction signal RF= [E]–[F].

The reproduction signal of the address information recorded by wobbles 4–7 on region 10 forming the pre-format region is detected, by a radial push-pull method, as a result of subtraction of the sum of laser light intensity [C] detected at region "C" 1020C and laser light intensity [D] detected at region "D" 1020D from the sum of laser light intensity [A] detected at region "A" 1020A and laser light intensity [B] detected at region "B" 1020B. More specifically, address signal RPP is detected by adders 500, 501 and a subtracter 502 being the elements of a circuit 50. Adder 500 outputs [A+B] that is the sum of laser light intensity [A] detected at region "A" 1020A and laser light intensity [B] detected at region "B" 1020B. Adder 501 outputs [C+D] that is the sum of laser light intensity [C] detected at region "C" 1020C and laser light intensity [D] detected at region "D" 1020D. Subtracter 502 then subtracts the output [C+D] of adder 501 from the output [A+B] of adder 500 and outputs the address signal RPP=[A+B]–[C+D].

Fine clock marks 3A, 3B in region 30 constituting the pre-format region are detected, by a tangential push-pull method, as a result of subtraction of the sum of laser light intensity [B] detected at region "B" 1020B and laser light intensity [C] detected at region "C" 1020C from the sum of laser light intensity [A] detected at region "A" 1020A and laser light intensity [D] detected at region "D" 1020D. More specifically, fine clock marks 3A, 3B are detected by adders 503, 504 and a subtracter 505 being the elements of circuit 50. Adder 503 outputs [A+D] that is the sum of laser light intensity [A] detected at region "A" 1020A and laser light intensity [D] detected at region "D" 1020D. Adder 504 outputs [B+C] that is the sum of laser light intensity [B] detected at region "B" 1020B and laser light intensity [C] detected at region "C" 1020C. Subtracter 505 subtracts the output [B+C] of adder 504 from the output [A+D] of adder 503 and outputs the fine clock mark signal TPP=[A+D]–[B+C].

Figure 5:
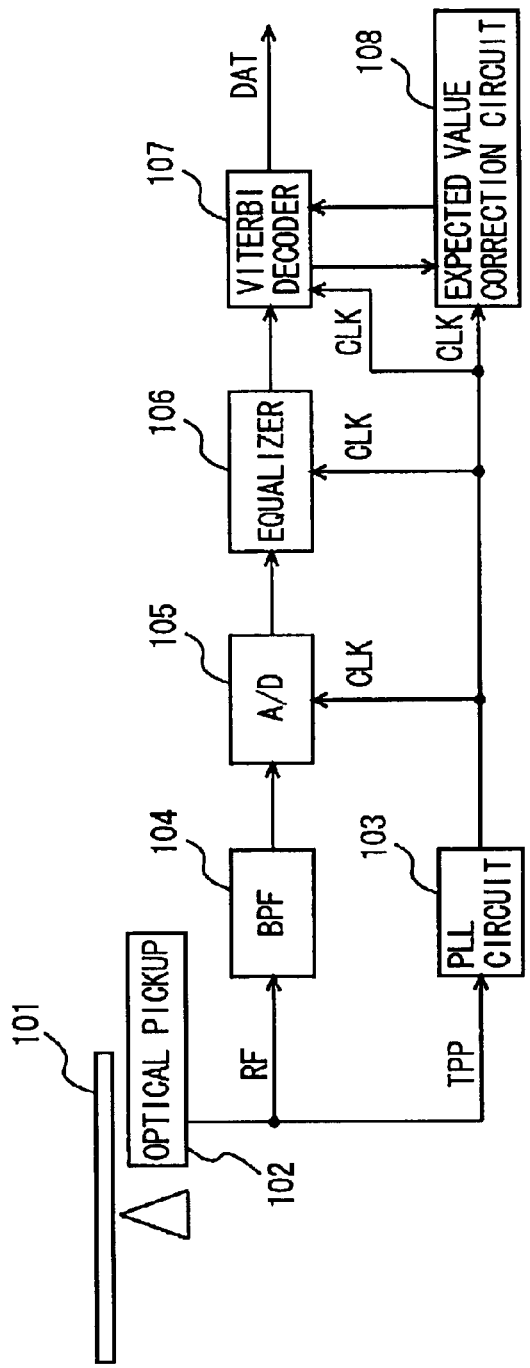
FIG. 5 is a schematic block diagram showing an optical disk apparatus according to a first embodiment of the present invention.

Referring to FIG. 5, an optical disk apparatus 100 according to the first embodiment includes an optical pickup 102, a PLL circuit 103, a BPF 104, an AD converter 105, an equalizer 106, a Viterbi decoder 107, and an expected value correction circuit 108.

Optical pickup 102 irradiates laser light onto magneto-optical disk 101 and detects its reflected light. PLL circuit 103 generates a reference clock CLK based on the fine clock mark signal TPP detected by optical pickup 102, such that a prescribed number of periodic signals, e.g., 532 periodic signals, are present between neighboring components of fine clock mark signal TPP. PLL circuit 103 outputs the generated reference clock CLK to AD converter 105, equalizer 106, Viterbi decoder 107 and expected value correction circuit 108.

BPF 104 cuts high or low frequencies of reproduction signal RF obtained by optical pickup 102. AD converter 105 samples reproduction signal RF in synchronization with reference clock CLK, and converts the reproduction signal RF from an analog signal to a digital signal. Equalizer 106 performs PR (1, 1) waveform equalization on the reproduction signal RF converted to the digital signal in synchronization with reference clock CLK. More specifically, equalizer 106 performs equalization such that the waveforms of the data preceding and succeeding the reproduction signal RF interfere one-to-one with each other. Viterbi decoder 107 uses expected values from expected value correction circuit 108 to convert the reproduction signal RF from multilevel data to binary data in synchronization with reference clock CLK, and outputs the converted reproduction signal DAT. Expected value correction circuit 108 corrects the expected values at Viterbi decoder 107 in a manner as will be described below, and outputs the corrected expected values to Viterbi decoder 107.

The reproduction signal DAT output from Viterbi decoder 107 is subjected to demodulating processing to remove the modulation applied at the time of recording, before being output as reproduction data. Other components, such as a spindle motor which rotates magneto-optical disk 101 at a prescribed rotation speed and a servo system included in optical pickup 102 which performs focus servo and tracking servo of an objective, are not shown in FIG. 5.

Figure 6:
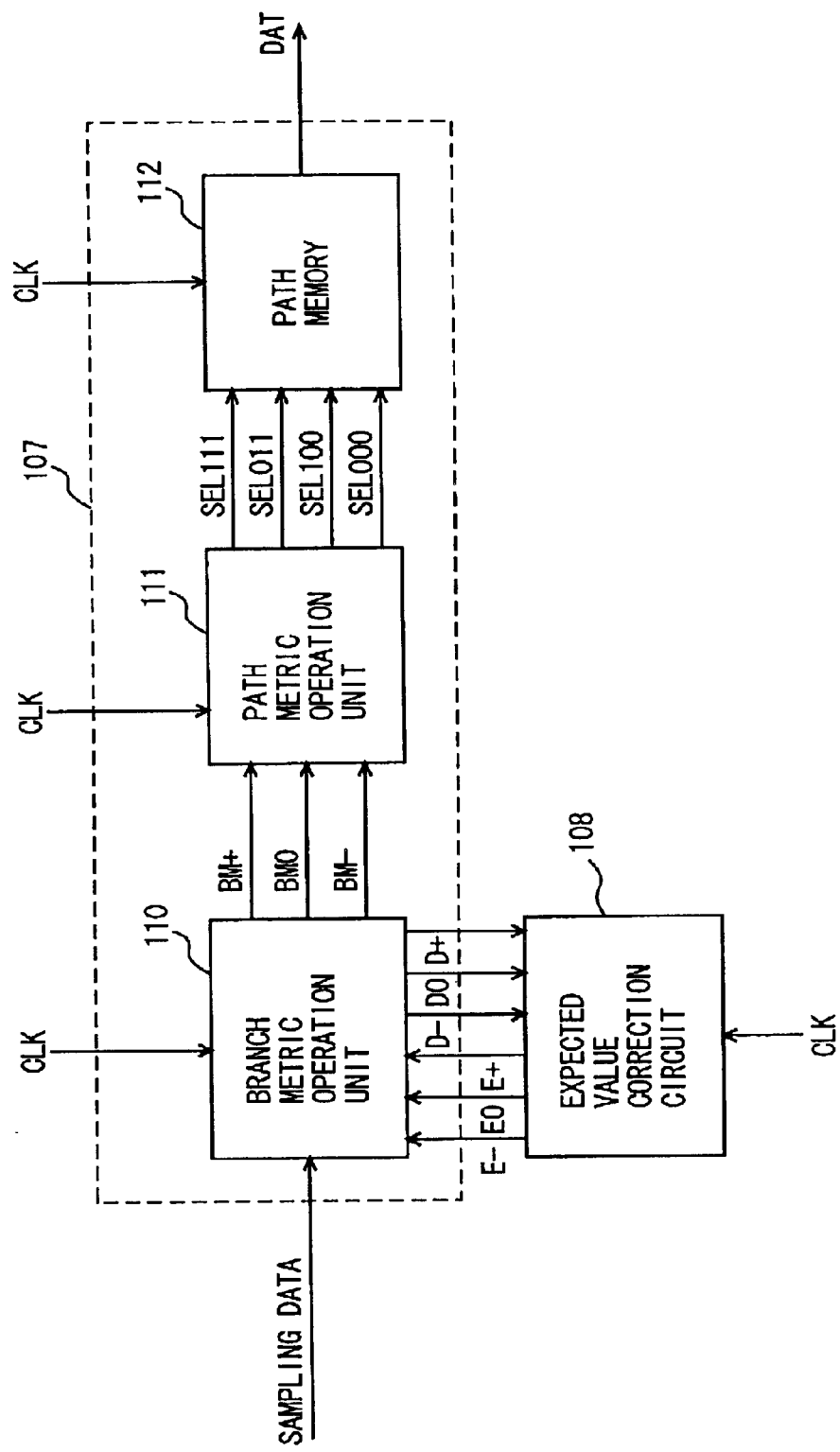
FIG. 6 is a block diagram of the Viterbi decoder shown in FIG. 5.

Referring to FIG. 6, Viterbi decoder 107 includes a branch metric operation unit 110, a path metric operation unit 111, and a path memory 112. Branch metric operation unit 110 calculates errors D+, D0, D− between sampling data of the reproduction signal and expected values, and outputs the calculated errors D+, D0, D− to expected value correction circuit 108. Branch metric operation unit 110 receives expected values E+, E0, E− corrected at expected value correction circuit 108, calculates square errors BM+, BM0, BM− of the sampling data and the expected values E+, E0, E− in synchronization with reference clock CLK, and outputs the calculated square errors BM+, BM0, BM− to path metric operation unit 111.

Path metric operation unit 111 calculates accumulative errors based on square errors BM+, BM0, BM−, and generates and outputs to path memory 112 select signals SEL000, SEL011, SEL100, SEL111 which make the calculated accumulative errors small. Path memory 112 selects the most likely data stream based on select signals SEL000, SEL011, SEL100, SEL111, and outputs the reproduction signal DAT of a binary value.

Figure 7:
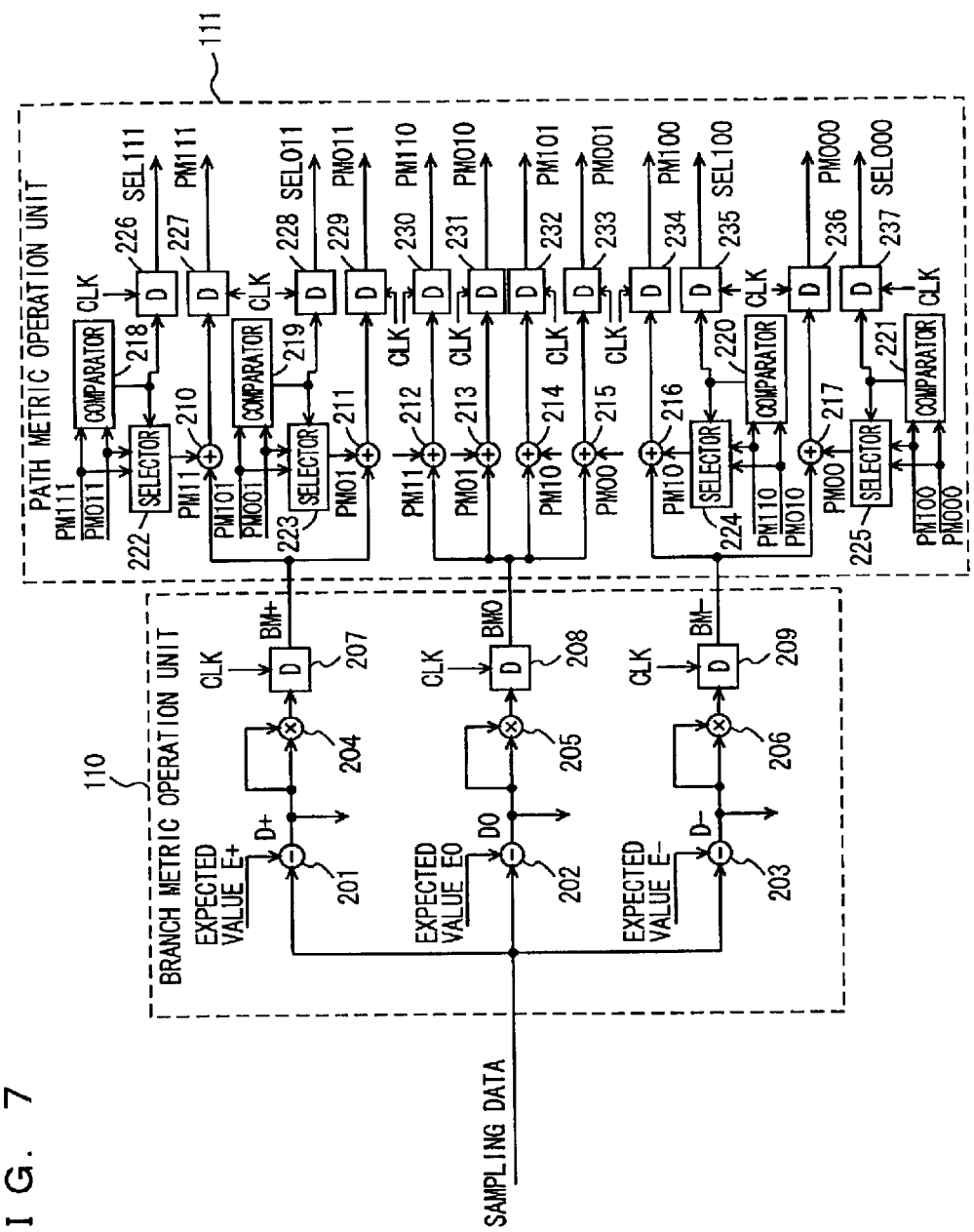
FIG. 7 is a circuit diagram of the branch metric operation unit and the path metric operation unit shown in FIG. 6.

Referring to FIG. 7, branch metric operation unit 110 includes subtracters 201–203, square multipliers 204–206, and flip-flops 207–209. Subtracter 201 subtracts expected value E+ from sampling data to obtain an error D+, and outputs the obtained error D+ to expected value correction circuit 108 and square multiplier 204. Subtracter 202 subtracts expected value E0 from the sampling data to obtain an error D0, and outputs the obtained error D0 to expected value correction circuit 108 and square multiplier 205. Subtracter 203 subtracts expected value E− from the sampling data to obtain an error D−, and outputs the obtained error D− to expected value correction circuit 108 and square multiplier 206.

Square multiplier 204 calculates the square of error D+ and outputs branch metric BM+ to flip-flop 207. Square multiplier 205 calculates the square of error D0 and outputs branch metric BM0 to flip-flop 208. Square multiplier 206 calculates the square of error D− and outputs branch metric BM− to flip-flop 209. Flip-flop 207 delays branch metric BM+ by one cycle of reference clock CLK and outputs it to path metric operation unit 111. Flip-flop 208 delays branch metric BM0 by one cycle of reference clock CLK to output to path metric operation unit 111. Flip-flop 209 delays branch metric BM− by one cycle of reference clock CLK to output to path metric operation unit 111.

As such, branch metric operation unit 110 calculates the errors and the square errors between the sampling data and respective expected values E+, E0, E−, and outputs the calculated errors to expected value correction circuit 108 and outputs the calculated square errors to path metric operation unit 111. Here, three expected values E+, E0, E− are employed because of the following reason. In the PR (1, 1) coding method, sampling data ideally takes three values and, for the purpose of selecting the most likely data stream, it is necessary to examine to which one of the three desired values the sampling data is closest. To this end, the three expected values are required as the reference values. The largest one of the three desired values is defined as a first desired value, the smallest one as a second desired value, and the intermediate value as a third desired value.

Path metric operation unit 111 includes adders 210–217, comparators 218–221, selectors 222–225, and flip-flops 226–237. Comparator 218 compares a path metric PM111 with a path metric PM011, and outputs a select signal for selecting the smaller path metric to selector 222 and flip-flop 226. Selector 222 selects the smaller one of path metrics PM011, PM111 based on the select signal from comparator 218, and outputs the selected path metric as a path metric PM11 to adders 210 and 212. Adder 210 adds branch metric BM+ from branch metric operation unit 110 and path metric PM11 from selector 222, and outputs the result to flip-flop 227. Flip-flop 227 latches the result obtained from adder 210 by one cycle of reference clock CLK, and outputs the latched result as a new path metric PM111 to comparator 218. Flip-flop 226 latches the select signal from comparator 218 by one cycle of reference clock CLK, and outputs the latched select signal as a select signal SEL111 to path memory 112.

Comparator 219 compares a path metric PM101 with a path metric PM001, and outputs a select signal for selecting the smaller path metric to selector 223 and flip-flop 228. Selector 223 selects the smaller one of path metrics PM001, PM101 based on the select signal from comparator 219, and outputs the selected path metric as a path metric PM01 to adders 211, 213. Adder 211 adds branch metric BM+ from branch metric operation unit 110 and path metric PM01 from selector 223, and outputs the result to flip-flop 229. Flip-flop 229 delays the result obtained from adder 211 by one cycle of reference clock CLK, and outputs it as a new path metric PM011 to comparator 218. Flip-flop 228 latches the select signal from comparator 219 by one cycle of reference clock CLK, and outputs the latched select signal as a select signal SEL011 to path memory 112.

Comparator 220 compares a path metric PM110 with a path metric PM010, and outputs a select signal for selecting the smaller path metric to selector 224 and flip-flop 235. Selector 224 selects the smaller one of path metrics PM110, PM010 based on the select signal from comparator 220, and outputs the selected path metric as a path metric PM10 to adders 214, 216. Adder 216 adds branch metric BM− from branch metric operation unit 110 and path metric PM10 from selector 224, and outputs the result to flip-flop 234. Flip-flop 234 delays the result obtained from adder 216 by one cycle of reference clock CLK, and outputs it as a new path metric PM100 to comparator 221. Flip-flop 235 latches the select signal from comparator 220 by one cycle of reference clock CLK, and outputs the latched select signal as a select signal SEL100 to path memory 112.

Comparator 221 compares a path metric PM100 with a path metric PM000 and outputs a select signal for selecting the smaller path metric to selector 225 and flip-flop 237. Selector 225 selects the smaller one of path metrics PM100, PM000 based on the select signal from comparator 221, and outputs the selected path metric as a path metric PM00 to adders 215, 217. Adder 217 adds branch metric BM− from branch metric operation unit 110 and path metric PM00 from selector 225, and outputs the result to flip-flop 236. Flip-flop 236 delays the result obtained from adder 217 by one cycle of reference clock CLK, and outputs it as a new path metric PM000 to comparator 221. Flip-flop 237 latches the select signal from comparator 221 by one cycle of reference clock CLK, and outputs the latched select signal as a select signal SEL000 to path memory 112.

Adder 212 adds path metric PM11 from selector 222 and branch metric BM0 from branch metric operation unit 110, and outputs the result to flip-flop 230. Flip-flop 230 delays the result obtained from adder 212 by one cycle of reference clock CLK, and outputs it as path metric PM110 to comparator 220.

Adder 213 adds path metric PM01 from selector 223 and branch metric BM0 from branch metric operation unit 110, and outputs the result to flip-flop 231. Flip-flop 231 delays the result obtained from adder 213 by one cycle of reference clock CLK, and outputs it as path metric PM010 to comparator 220.

Adder 214 adds path metric PM10 from selector 224 and branch metric BM0 from branch metric operation unit 110, and outputs the result to flip-flop 232. Flip-flop 232 delays the result obtained from adder 214 by one cycle of reference clock CLK, and outputs it as path metric PM101 to comparator 219.

Adder 215 adds path metric PM00 from selector 225 and branch metric BM0 from branch metric operation unit 110, and outputs the result to flip-flop 233. Flip-flop 233 delays the result obtained from adder 215 by one cycle of reference clock CLK, and outputs it as path metric PM001 to comparator 219.

As such, path metric operation unit 111 calculates accumulative errors (path metrics) with respect to branch metrics BM+, BM0, BM− received from branch metric operation unit 110, and outputs select signals SEL000, SEL100, SEL011, SEL111 for selecting the smaller accumulative errors to path memory 112.

Figure 8:
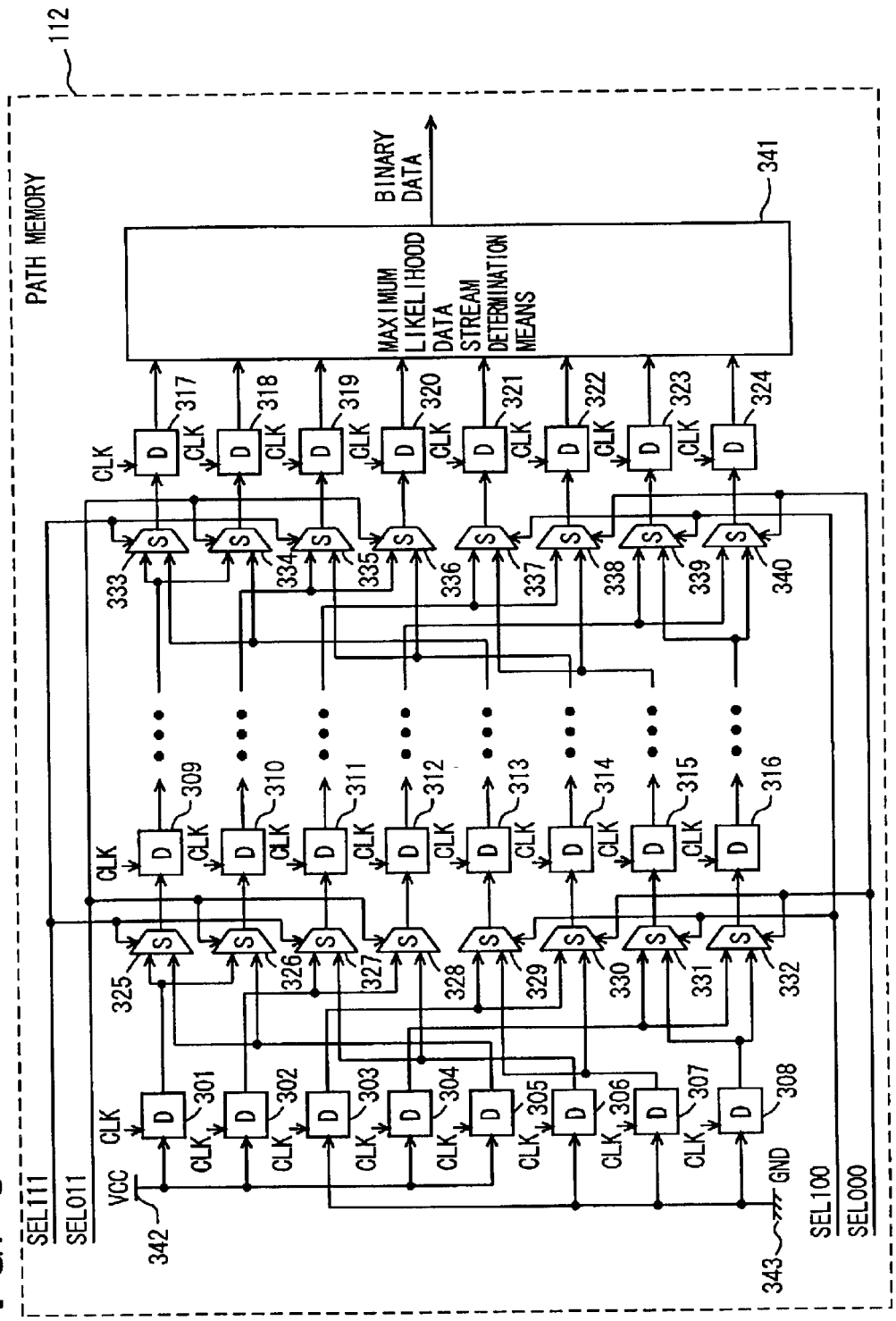
FIG. 8 is a circuit and block diagram of the path memory shown in FIG. 6.

Referring to FIG. 8, path memory 112 includes flip-flops 301–324, selectors 325–340, and a maximum likelihood data stream determination means 341. Flip-flops 301, 302, 304 and 305 latch digital data "1" being a power supply voltage VCC supplied from a power supply node 342 by one cycle of reference clock CLK, and output the latched digital data "1" to selectors 325 and 326, selectors 327 and 328, selectors 331 and 332, and selectors 325 and 326, respectively. Flip-flops 303, 306, 307 and 308 latch digital data "0" being a ground voltage GND supplied from a ground node 343 by one cycle of reference clock CLK, and outputs the latched digital data "0" to selectors 329 and 330, selectors 327 and 328, selectors 329 and 330, and selectors 331 and 332, respectively.

Selector 325 selects either one of two pieces of digital data input from flip-flops 301, 305 based on select signal SEL111, and outputs the selected digital data to flip-flop 309. Selector 326 selects either one of the two pieces of digital data input from flip-flops 301, 305 based on select signal SEL011, and outputs the selected digital data to flip-flop 310. Selector 327 selects either one of the two pieces of digital data input from flip-flops 302, 306 based on select signal SEL111, and outputs the selected digital data to flip-flop 311. Selector 328 selects either one of the two pieces of digital data input from flip-flops 302, 306 based on select signal SEL011, and outputs the selected digital data to flip-flop 312.

Selector 329 selects either one of the two pieces of digital data input from flip-flops 303, 307 based on select signal SEL100, and outputs the selected digital data to flip-flop 313. Selector 330 selects either one of the two pieces of digital data input from flip-flops 303, 307 based on select signal SEL000, and outputs the selected digital data to flip-flop 314. Selector 331 selects either one of the two pieces of digital data input from flip-flops 304, 308 based on select signal SEL100, and outputs the selected digital data to flip-flop 315. Selector 332 selects either one of the two pieces of digital data input from flip-flops 304, 308 based on select signal SEL000, and outputs the selected digital data to flip-flop 316.

Flip-flops 309–316 latch the digital data input from selectors 325–332, respectively, by one cycle of reference clock CLK, and output the latched digital data to corresponding selectors in the succeeding stage.

Selectors 333 and 335 each select either one of two pieces of digital data based on select signal SEL111. Selectors 334 and 336 each select either one of two pieces of digital data based on select signal SEL011. Selectors 337 and 339 each select either one of two pieces of digital data based on select signal SEL100. Selectors 338 and 340 each select either one of two pieces of digital data based on select signal SEL000.

Flip-flops 317–324 latch the digital data from selectors 333–340, respectively, by one cycle of reference clock CLK, and output the latched digital data to maximum likelihood data stream determination means 341. Maximum likelihood data stream determination means 341 selects and outputs the most likely binary data by means of majority decision, path metric minimized method or the like.

Figure 9:
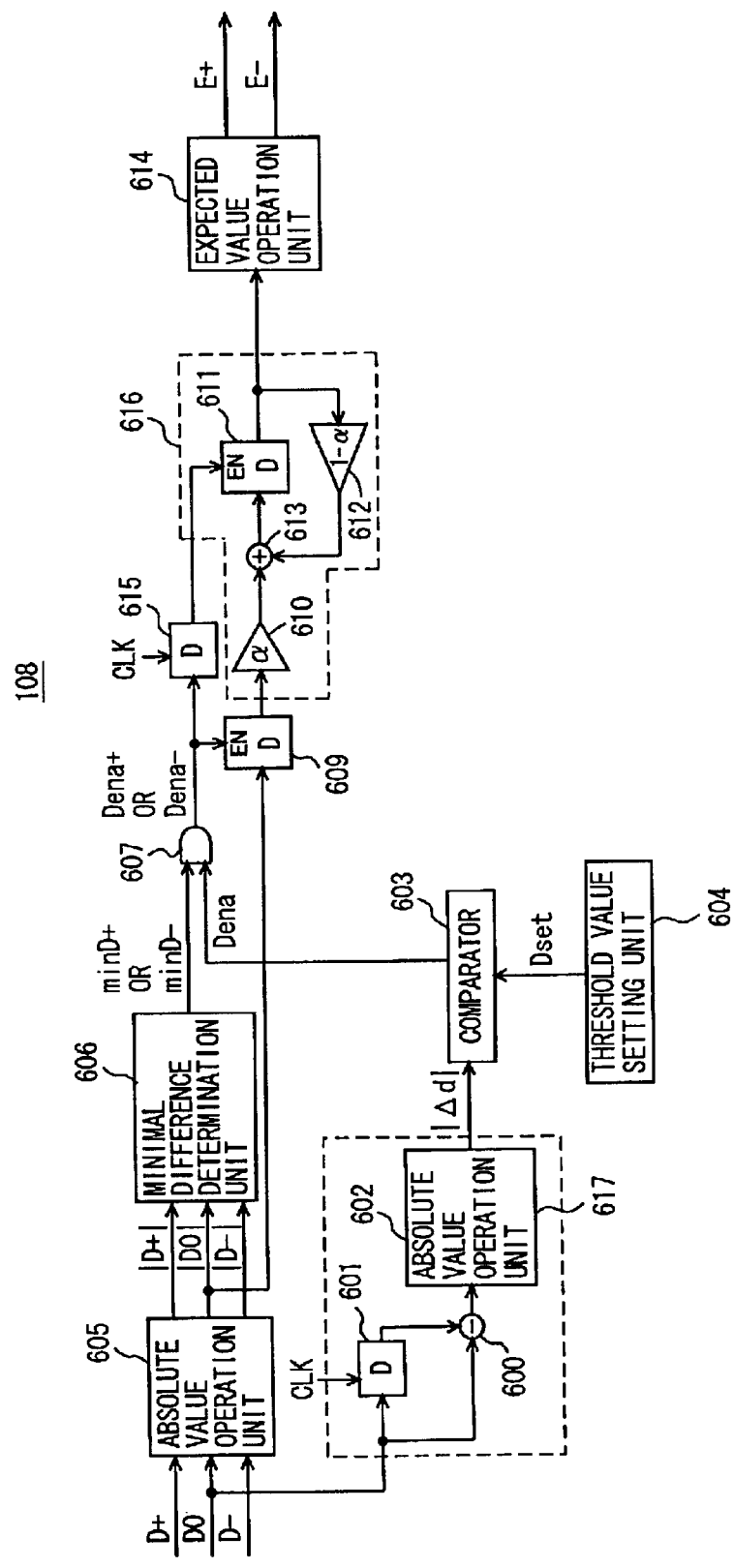
FIG. 9 is a circuit and block diagram of the expected value correction circuit shown in FIG. 5.

Referring to FIG. 9, expected value correction circuit 108 includes a comparator 603, a threshold value setting unit 604, an absolute value operation unit 605, a minimal difference determination unit 606, an AND gate 607, flip-flops 609 and 615, an expected value operation unit 614, an averaging circuit 616, and a difference circuit 617.

Absolute value operation unit 605 calculates absolute values |D+|, |D0|, |D−| of errors D+, D0, D− input from branch metric operation unit 110 in Viterbi decoder 107, and outputs the calculated absolute values |D+|, |D0|, |D−| to minimal difference determination unit 606, and also outputs absolute value |D0| to flip-flop 609.

Difference circuit 617 includes a subtracter 600, a flip-flop 601, and an absolute value operation unit 602. Flip-flop 601 latches error D0 by one cycle of reference clock CLK, and outputs the latched error D0 to subtracter 600. Subtracter 600 calculates a difference Δd between the error from flip-flop 601 and error D0, and outputs the calculated result to absolute value operation unit 602. Absolute value operation unit 602 calculates an absolute value |Δd| of difference Δd, and outputs it to comparator 603. Threshold value setting unit 604 holds a threshold value Dset having been set by a personal computer, microcomputer, circuit or the like, and outputs the threshold value Dset to comparator 603. More specifically, with respect to the error D0 between the sampling data and expected value E0, difference circuit 617 calculates the change of error D0 from one clock ago, and outputs the calculated result to comparator 603. Thus, absolute value |Δd| indicates a change of the sampling data from one clock ago.

Comparator 603 compares absolute value |Δd| with threshold value Dset, and outputs a signal Dena having an L (logical low) level when |Δd|>Dset and an H (logical high) level when |Δd|<Dset to AND gate 607. More specifically, comparator 603 outputs, to AND gate 607, signal Dena that attains an L level in a region where variation of the sampling data is large and an H level in a region where the variation of the sampling data is small.

Minimal difference determination unit 606 determines which is the smallest among the input absolute values |D+|, |D0| and |D−|, and outputs a signal minD+ of an H level when absolute value |D+| is the smallest, outputs a signal minD− of an H level when absolute value |D−| is the smallest, and outputs a signal of an L level when absolute value |D0| is the smallest. AND gate 607 carries out logical AND of signal minD+ or minD− and signal Dena, and outputs a signal Dena+ or Dena−. Flip-flop 609 extracts absolute values |D0| in a time period where signal Dena+ or Dena− is at an H level, and outputs the extracted absolute values to averaging circuit 616. Flip-flop 615 latches signal Dena+ or Dena− by one cycle of reference clock CLK, and outputs the latched signal Dena+ or Dena− to averaging circuit 616.

Averaging circuit 616 consists of multipliers 610 and 612, an adder 613, and a flip-flop 611. Multiplier 610 multiplies absolute value |D0| latched by flip-flop 609 by α(0<α<1) for output to adder 613. Adder 613 adds the output value of multiplier 610 and an output value of multiplier 612 and outputs it to flip-flop 611. Flip-flop 611 extracts the average values output from adder 613 in a time period where signal Dena+ or Dena− is at an H level, and outputs the extracted average values to multiplier 612 and to expected value operation unit 614. Multiplier 612 multiplies the average value from flip-flop 611 by (1−α) to output to adder 613. As such, averaging circuit 616 adds the absolute value |D0| multiplied by α and the average value of one clock ago multiplied by (1−α) to average the absolute values |D0|.

Expected value operation unit 614 calculates a corrected expected value E+ based on the output value from averaging circuit 616 and also calculates a corrected expected value E− that takes a position symmetrical to the calculated, corrected expected value E+ with respect to a DC level of the reproduction signal or expected value E0, and outputs the corrected expected values E+ and E− to Viterbi decoder 107.

Figure 10:
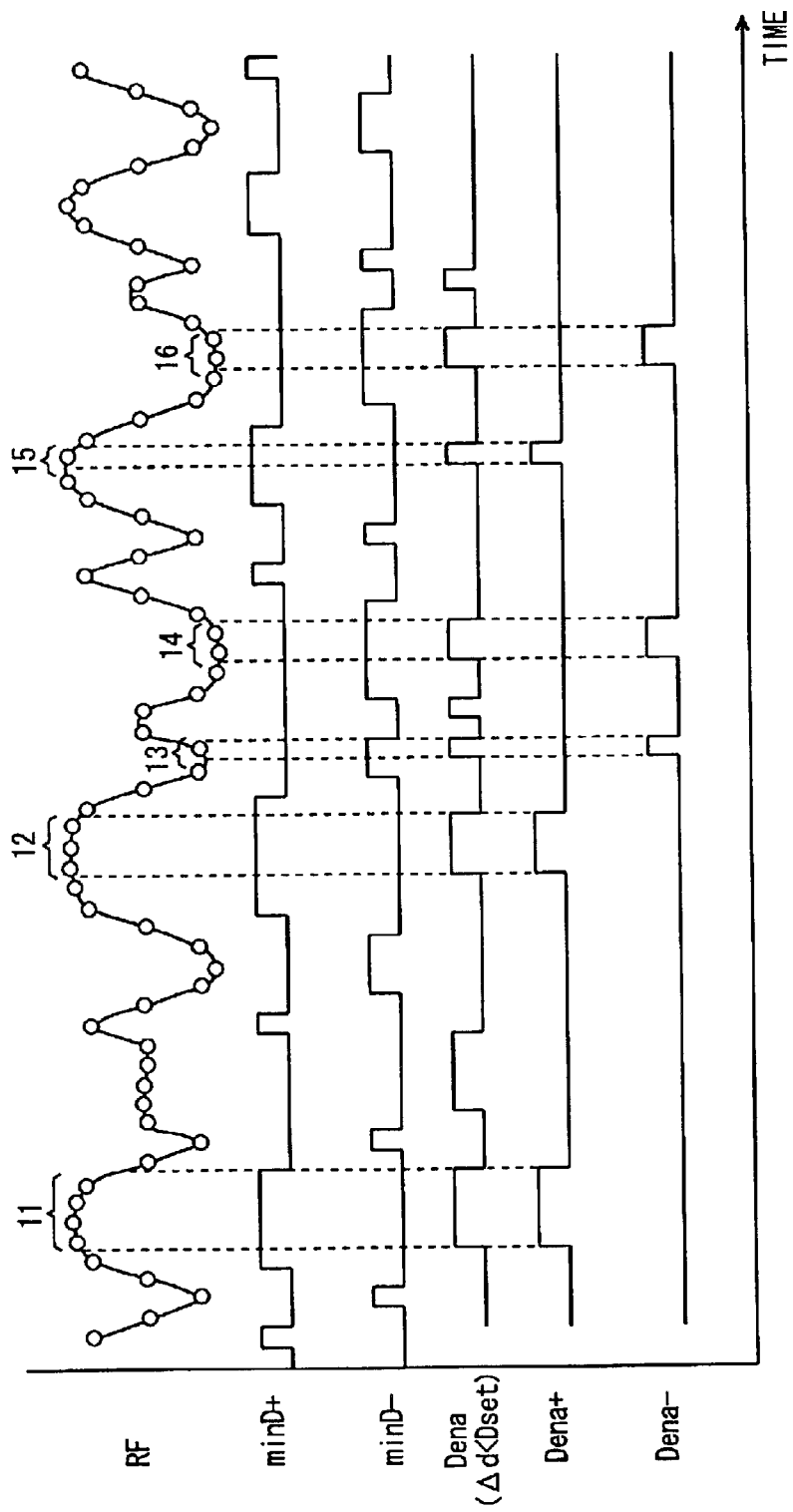
FIG. 10 is a signal timing chart illustrating an operation for correcting expected values in the expected value correction circuit shown in FIG. 9.

Referring to FIG. 10, a correcting operation of expected values in expected value correction circuit 108 is described. The reproduction signal detected from magneto-optical disk 101 by optical pickup 102 has its high or low frequencies cut by BPF 104, is sampled by AD converter 105 in synchronization with reference clock CLK, and has its waveform equalized by equalizer 106 before being input to Viterbi decoder 107. Thus, Viterbi decoder 107 receives reproduction signal RF of multilevel data. Branch metric operation unit 110 in Viterbi decoder 107 calculates errors D+, D0, D− between each sampling data of the input reproduction signal RF and expected values E+, E0, E−, and outputs them to expected value correction circuit 108.

In expected value correction circuit 108, absolute value operation unit 605 calculates absolute values of input errors D+, D0, D−, and outputs the calculated absolute values |D+|, |D0|, |D−| to minimal difference determination unit 606, and also outputs absolute value |D0| to flip-flop 609. Minimal difference determination unit 606 generates signal minD+ or minD− based on absolute values |D+|, |D0|, |D−| in the above-described manner, and outputs the generated signal minD+ or minD− to AND gate 607.

Difference circuit 617 calculates a difference of error D0 with that of one clock ago, and outputs an absolute value |Δd| of the calculated difference to comparator 603. Comparator 603 compares absolute value |Δd| with threshold value Dset, and outputs a signal Dena to AND gate 607. AND gate 607 carries out logical AND of signal minD+ or minD− and signal Dena, and outputs signal Dena+ or Dena− to flip-flop 615. Flip-flop 615 latches signal Dena+ or Dena− by one cycle of reference clock CLK, and outputs the latched signal Dena+ or Dena− to averaging circuit 616.

Flip-flop 609 extracts absolute values |D0| output from absolute value operation unit 605 in a time period where signal Dena+ or Dena− is at an H level, and outputs the extracted absolute values to averaging circuit 616.

Averaging circuit 616 averages absolute values |D0| in the above-described manner, and outputs the averaged absolute value to expected value operation unit 614. In this case, the absolute values |D0| input to averaging circuit 616 are absolute values of the errors between the sampling data and expected value E0, and therefore, they should approximate the absolute value of the first desired value or the second desired value during the time period where signal Dena+ or Dena− is at an H level. More specifically, by having flip-flop 609 latching absolute values |D0| during the time period where signal Dena+ or Dena− is at an H level, values of reproduction signal RF close to the absolute value of the first desired value or the second desired value are extracted.

Expected value operation unit 614 makes correction of the expected values based on the average value input from averaging circuit 616 in the above-described manner, and outputs the corrected expected values E+, E− to Viterbi decoder 107.

As such, expected value correction circuit 108 extracts amplitude values of reproduction signal RF in regions 11–16 where the signal has approximately uniform amplitudes, and obtains the average values of the extracted amplitude values to correct the expected values E+, E−. Here, expected value E0 is not corrected on the presumption that reproduction signal RF has its plus side and minus side symmetrical to each other with respect to the DC component level of the reproduction signal.

Referring again to FIG. 5, a signal reproducing operation in optical disk apparatus 100 is described. Here, it is assumed that driving of the spindle motor, driving of a semiconductor laser included in optical pickup 102, and tracking servo and focus servo of an objective lens included in optical pickup 102 have been completed.

Optical pickup 102 irradiates laser light onto magneto-optical disk 101 and detects its reflected light to detect fine clock mark signal TPP and reproduction signal RF. It outputs the detected reproduction signal RF and fine clock mark signal TPP to BPF 104 and PLL circuit 103, respectively.

PLL circuit 103 generates reference clock CLK based on fine clock mark signal TPP, and outputs the generated reference clock CLK to AD converter 105, equalizer 106, Viterbi decoder 107 and expected value correction circuit 108.

BPF 104 cuts high or low frequencies of the reproduction signal from optical pickup 102. AD converter 105 samples the reproduction signal in synchronization with reference clock CLK. Equalizer 106 performs waveform-equalization of the reproduction signal being the sampling data in synchronization with reference clock CLK, and outputs the reproduction signal to Viterbi decoder 107.

In response, branch metric operation unit 110 in Viterbi decoder 107 calculates errors D+, D0, D− of the sampling data and expected values E+, E0, E−, and outputs them to expected value correction circuit 108. Expected value correction circuit 108 corrects expected values E+, E− in the above-described manner, and outputs the corrected expected values E+, E− to Viterbi decoder 107. Viterbi decoder 107 employs the corrected expected values E+, E− and expected value E0 being held to convert reproduction signal RF from multilevel data to binary data in the above-described manner, and outputs the reproduction signal DAT of binary data. Thereafter, reproduction signal DAT is subjected to demodulation before being output as reproduction data. Thus, the signal reproducing operation from magneto-optical disk 101 is completed.

According to the first embodiment, the optical disk apparatus is provided with the expected value correction circuit which corrects the expected values in Viterbi decoding in accordance with the amplitude of the reproduction signal. Accordingly, the Viterbi decoding is performed accurately even if the reproduction signal varies in amplitude. As a result, accurate signal reproduction is ensured.

Second Embodiment

Figure 11:
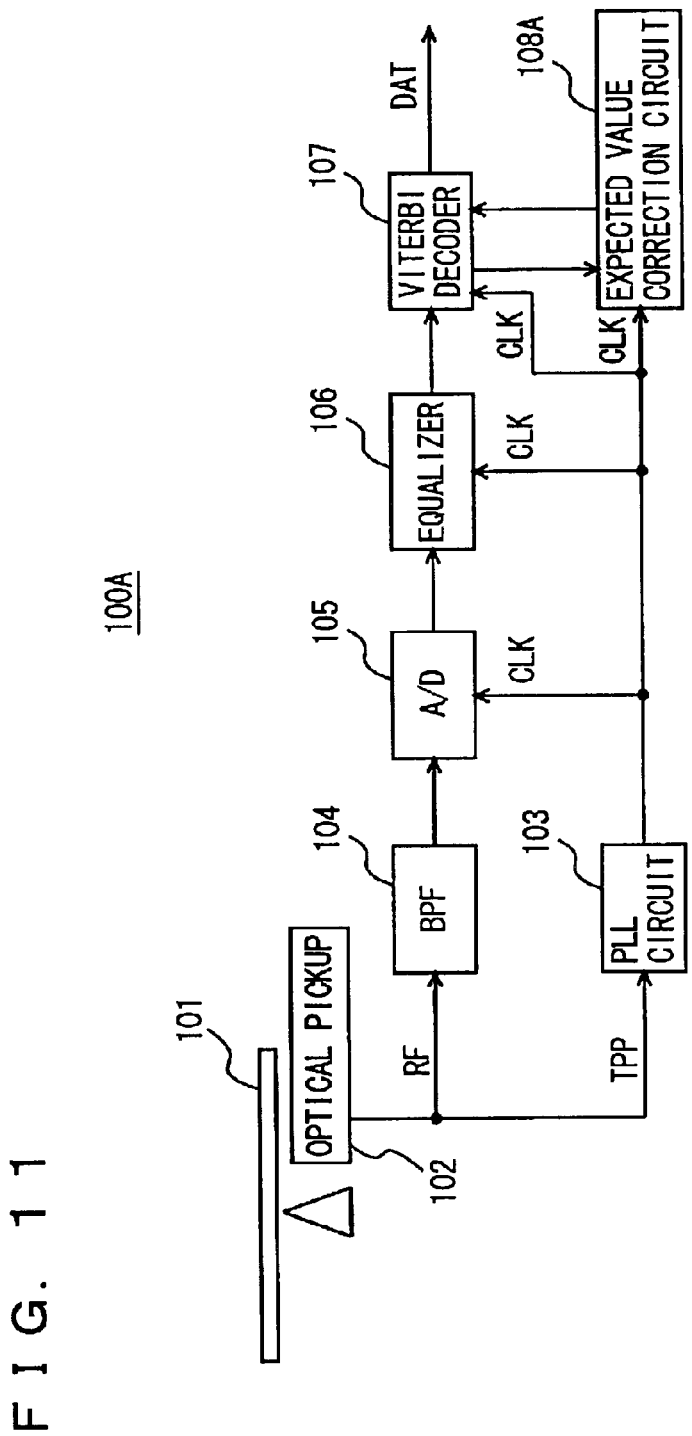
FIG. 11 is a schematic block diagram of the optical disk apparatus according to a second embodiment of the present invention.

Referring to FIG. 11, the optical disk apparatus 100A according to the second embodiment is identical to optical disk apparatus 100 except that the expected value correction circuit 108 of optical disk apparatus 100 is replaced with an expected value correction circuit 108A.

Figure 12:
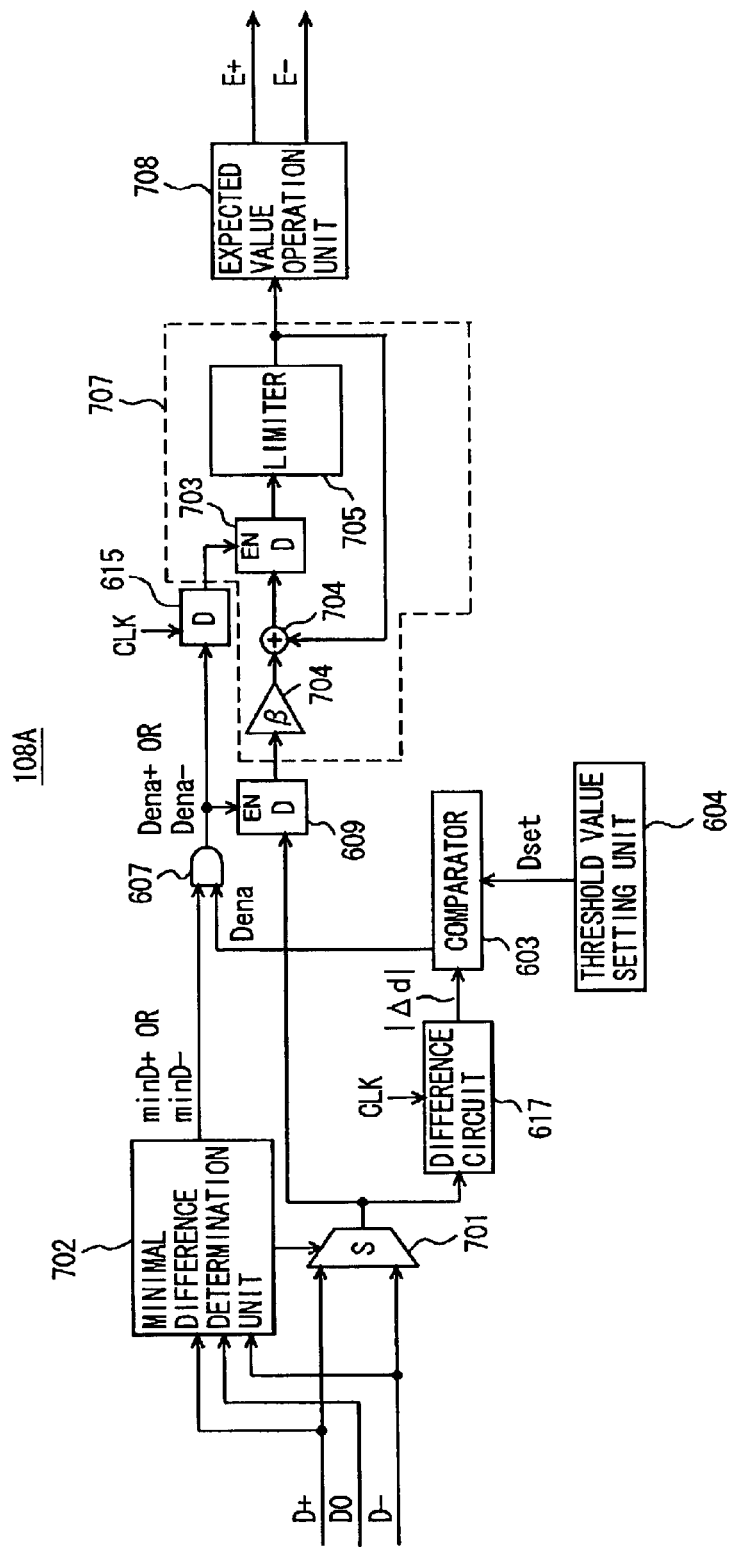
FIG. 12 is a circuit and block diagram of the expected value correction circuit shown in FIG. 11.

Referring to FIG. 12, the expected value correction circuit 108A includes a selector 701, a minimal difference determination unit 702, a difference circuit 617, a comparator 603, a threshold value setting unit 604, an AND gate 608, flip-flops 609 and 615, an averaging circuit 707, and an expected value operation unit 708. Comparator 603, threshold value setting unit 604, flip-flops 609 and 615, and difference circuit 617 are identical to those described above.

Minimal difference determination unit 702 determines which is the smallest among errors D+, D0, D− input from Viterbi decoder 107, and generates, when error D+ is the smallest, signal minD+ of an H level and a select signal for selecting error D+. It generates signal minD− of an H level and a select signal for selecting error D− when error D− is the smallest, and generates a signal of an H level when error D0 is the smallest. Minimal difference determination unit 702 outputs the generated signal minD+ or minD− to AND gate 608, and outputs the select signal to selector 701.

Selector 701 selects either one of errors D+, D− based on the select signal from minimal difference determination unit 702, and outputs the selected error D+ or D− to flip-flop 609 and difference circuit 617. AND gate 608 carries out logical AND of signal minD+ or minD− and signal Dena from comparator 603.

Averaging circuit 707 includes a multiplier 704, an adder 706, a flip-flop 703 and a limiter 705. Multiplier 704 multiplies the output value of flip-flop 609 by β(0<β<1), and outputs it to adder 706. Adder 706 adds the output value of multiplier 704 and an output value of limiter 705. Flip-flop 703 latches the output value of adder 706 for a time period where signal Dena+ or Dena− latched by flip-flop 615 by one cycle of reference clock CLK is at an H level, and outputs the latched output value to limiter 705. Limiter 705 has preset upper and lower limit values and, when an input value falls outside the range between the lower and upper limit values, outputs the upper limit value or the lower limit value as an output value to adder 706 and to expected value operation unit 708.

Averaging circuit 707 adds error D+ or D− input and an average value of one clock ago to calculate the average value of error D+ or D−, and outputs it to expected value operation unit 708. Averaging circuit 707 is provided with limiter 705 because of the following reason. Since a value being input to averaging circuit 707 is not an absolute value of error D+ or D−, averaging circuit 707 should prevent the average value from largely shifting in a minus direction during the averaging process, so as to suppress overdrive of itself.

Expected value operation unit 708 corrects expected value E+ or E− based on the input from averaging circuit 707, and outputs the corrected expected value E+ or E− to Viterbi decoder 107.

A correcting operation of expected values E+, E− in expected value correction circuit 108A is now described. Minimal difference determination unit 702 determines which is the smallest among the input errors D+, D0, D− and, as described above, generates signal minD+ or minD− and a select signal, and outputs the signal minD+ or minD− to AND gate 608 and the select signal to selector 701. Selector 701 selects error D+ or D− based on the select signal from minimal difference determination unit 702, and outputs it to difference circuit 617 and to flip-flop 609.

Difference circuit 617 calculates a difference of input error D+ or D− with that of one clock ago, and outputs an absolute value |Δd| of the calculated difference to comparator 603. Comparator 603 compares absolute value |Δd| with threshold value Dset, and outputs signal Dena to AND gate 608. AND gate 608 then carries out logical AND of signal minD+ or minD− and signal Dena, and outputs signal Dena+ or Dena− to flip-flops 609 and 615. Flip-flop 609 extracts, of the errors D+ or D− selected by selector 701, those in a time period where signal Dena+ or Dena− is at an H level, and outputs the extracted errors to averaging circuit 707.

Flip-flop 615 latches signal Dena+ or Dena− by one cycle of reference clock CLK, and outputs the latched signal Dena+ or Dena− to averaging circuit 707. In response, averaging circuit 707 calculates an average value of errors D+ or D− in the above-described manner, and outputs the calculated average value to expected value operation unit 708. Expected value operation unit 708 corrects expected values E+, E− based on the average value input from averaging circuit 707, and outputs the corrected expected values E+, E− to Viterbi decoder 107. In this case, expected value operation unit 708 holds reference values for expected values E+, E−. It corrects the reference values using the average value input from averaging circuit 707, and outputs the corrected expected values E+, E− to Viterbi decoder 107. More specifically, expected value operation unit 708 holds reference expected values, and adds the average value received from averaging circuit 707 to the reference expected value to correct the expected value E+. It outputs the corrected expected value E+ as well as the expected value E− that takes a position symmetrical to the corrected expected value E+ with respect to the DC component of the reproduction signal or expected value E0.

As such, expected value correction circuit 108A extracts errors between the sampling data of reproduction signal RF in regions 11–16 shown in FIG. 10 and the expected values, and calculates the average value of the extracted errors to correct expected values E+, E−.

Otherwise, the second embodiment is identical to the first embodiment.

According to the second embodiment, the optical disk apparatus is provided with the expected value correction circuit which corrects the expected values in Viterbi decoding in accordance with the amplitude of the reproduction signal. As such, accurate Viterbi decoding is possible even if the amplitude of the reproduction signal varies, which ensures accurate signal reproduction.

Third Embodiment

Figure 13:
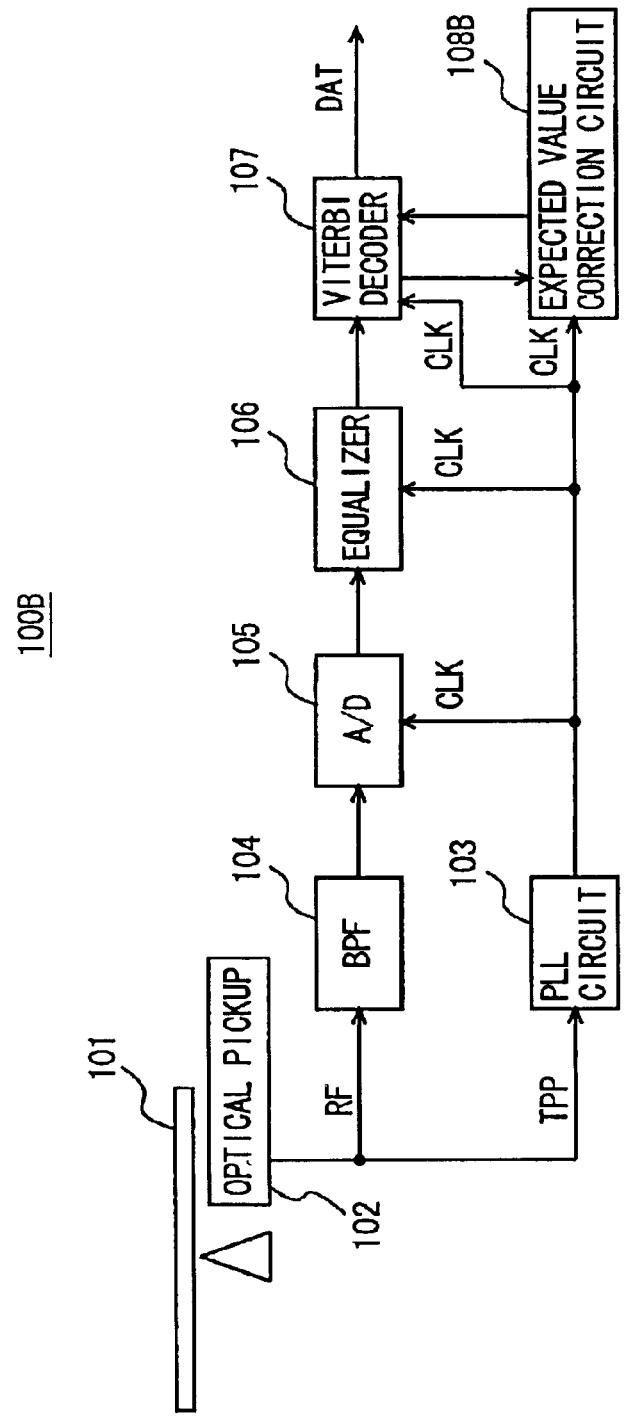
FIG. 13 is a schematic block diagram of the optical disk apparatus according to a third embodiment of the present invention.

Referring to FIG. 13, the optical disk apparatus 100B according to the third embodiment is identical to optical disk apparatus 100 except that expected value correction circuit 108 is replaced with an expected value correction circuit 108B.

Figure 14:
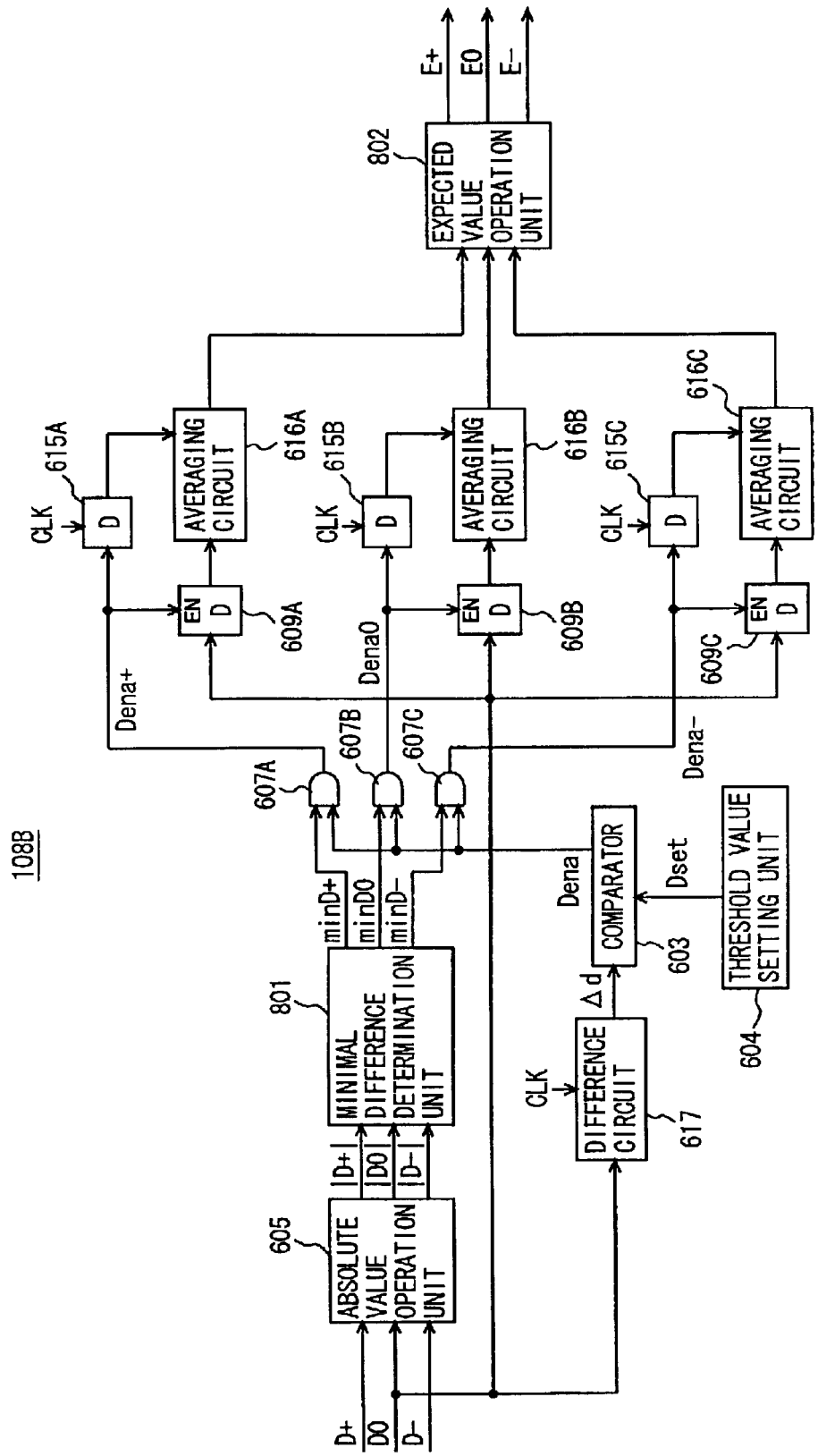
FIG. 14 is a circuit and block diagram of the expected value correction circuit shown in FIG. 13.

Referring to FIG. 14, the expected value correction circuit 108B includes a comparator 603, a threshold value setting unit 604, an absolute value operation unit 605, a minimal difference determination unit 801, a difference circuit 617, AND gates 607A, 607B, 607C, flip-flops 609A, 609B, 609C, 615A, 615B, 615C, averaging circuits 616A, 616B, 616C, and an expected value operation unit 802. Comparator 603, threshold value setting unit 604, absolute value operation unit 605 and difference circuit 617 are identical to those described above. Averaging circuits 616A, 616B, 616C each have a circuit configuration identical to that of averaging circuit 616 shown in FIG. 9.

Minimal difference determination unit 801 determines which is the smallest among the absolute values |D+|, |D0|, |D−| input from absolute value operation unit 605, and outputs signal minD+ of an H level and signals minD0, minD− of an L level at the time when absolute value |D+| is the smallest, outputs signal minD0 of an H level and signals minD+, minD− of an L level when absolute value |D0| is the smallest, and outputs signal minD− of an H level and signals minD+, minD0 of an L level when absolute value |D−| is the smallest.

AND gate 607A carries out logical AND of signal minD+ and signal Dena and outputs signal Dena+ to flip-flops 609A, 615A. AND gate 607B carries out logical AND of signal minD0 and signal Dena and outputs signal Dena0 to flip-flops 609B, 615B. AND gate 607C carries out logical AND of signal minD– and signal Dena and outputs signal Dena– to flip-flops 609C, 615C.

Flip-flop 609A extracts, from errors D0, those in a time period where signal Dena+ is at an H level, and outputs the extracted errors to averaging circuit 616A. Flip-flop 609B extracts, from errors D0, those in a time period where signal Dena0 is at an H level, and outputs the extracted errors to averaging circuit 616B. Flip-flop 609C extracts, from errors D0, those in a time period where signal Dena– is at an H level, and outputs the extracted errors to averaging circuit 616C.

Flip-flop 615A latches signal Dena+ by one cycle of reference clock CLK, and outputs the latched signal Dena+ to averaging circuit 616A. Flip-flop 615B latches signal Dena0 by one cycle of reference clock CLK, and outputs the latched signal Dena0 to averaging circuit 616B. Flip-flop 615C latches signal Dena– by one cycle of reference clock CLK, and outputs the latched signal Dena– to averaging circuit 616C.

Averaging circuits 616A, 616B, 616C average the input errors in the above-described manner, and output the resultant average values to expected value operation unit 802. Expected value operation unit 802 corrects expected values E+, E0, E– based on the input average values, and outputs the corrected expected values E+, E0, E– to Viterbi decoder 107.

Figure 15:
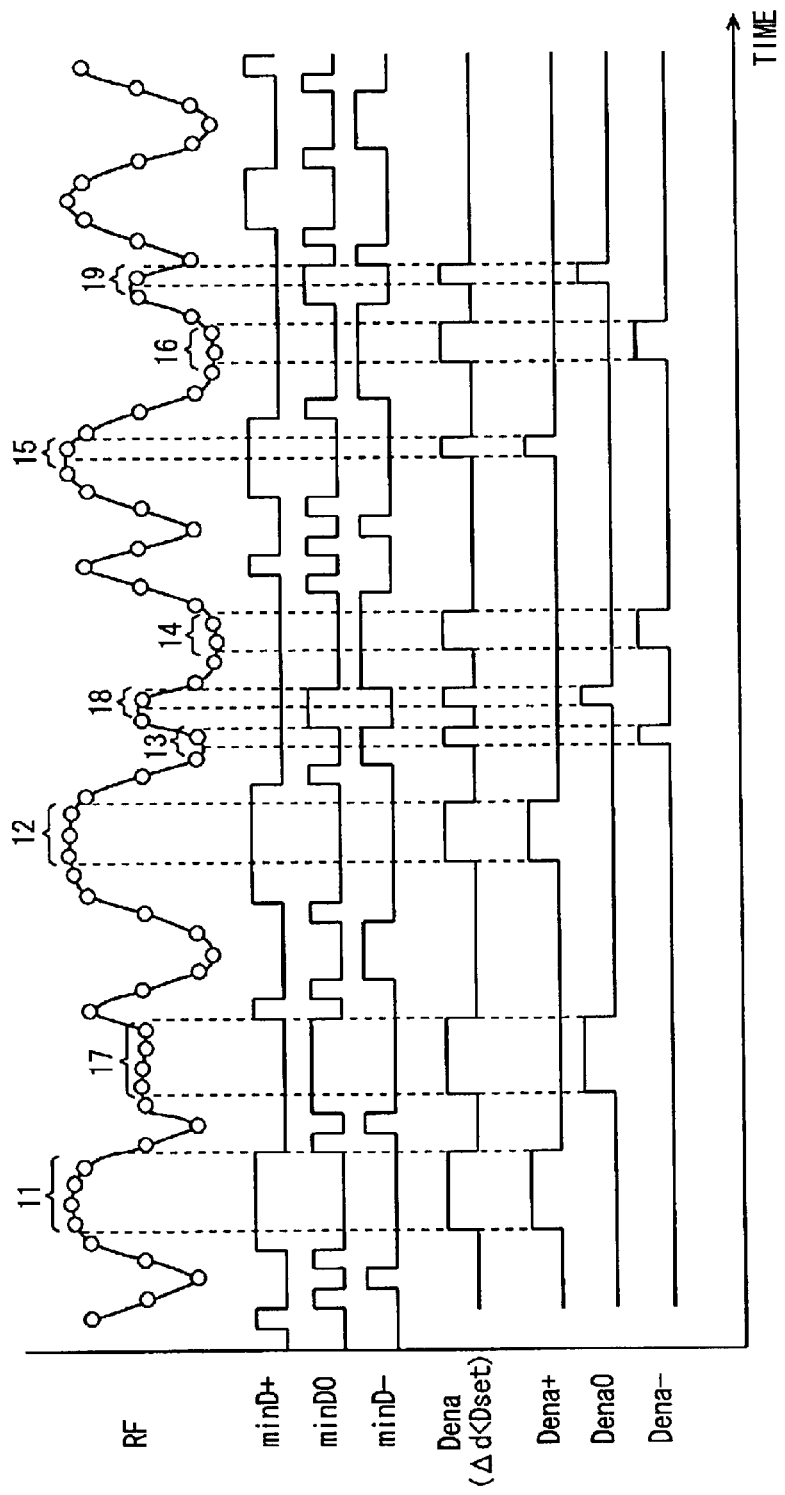
FIG. 15 is a signal timing chart illustrating a correcting operation of expected values in the expected value correction circuit shown in FIG. 14.

Referring to FIG. 15, an operation for correcting expected values E+, E0, E– in expected value correction circuit 108B is described. When errors D+, D0, D– are input from Viterbi decoder 107, absolute value operation unit 605 calculates absolute values of errors D+, D0, D–, and outputs the absolute values |D+|, |D0|, |D–| to minimal difference determination unit 801. Minimal difference determination unit 801 determines which is the smallest among the input absolute values |D+|, |D0|, |D–|, and generates signal minD+ of an H level and signals minD0, minD– of an L level when absolute value |D+| is the smallest, generates signal minD0 of an H level and signals minD+, minD– of an L level when absolute value |D0| is the smallest, and generates signal minD– of an H level and signals minD+, minD0 of an L level when absolute value |D–| is the smallest.

Difference circuit 617, as described above, calculates a difference of error D0 with that of one clock ago, and outputs an absolute value |Δd| of the calculated difference to comparator 603. Comparator 603 compares absolute value |Δd| with threshold value Dset, and generates signal Dena in the above-described manner. AND gate 607A carries out logical AND of signal minD+ and signal Dena, and outputs signal Dena+ to flip-flops 609A, 615A. AND gate 607B carries out logical AND of signal minD0 and signal Dena, and outputs signal Dena0 to flip-flops 609B, 615B. AND gate 607C carries out logical AND of signal minD– and signal Dena, and outputs signal Dena– to flip-flops 609C, 615C.

In response, flip-flop 609A extracts errors between the sampling data in regions 11, 12, 15 and expected value E0 based on the input error D0 and signal Dena+, and outputs the extracted errors to averaging circuit 616A. Flip-flop 609B extracts errors between the sampling data in regions 17, 18, 19 and expected value E0 based on the input error D0 and signal Dena0, and outputs the extracted errors to averaging circuit 616B. Flip-flop 609C extracts errors between the sampling data in regions 13, 14, 16 and expected value E0 based on the input error D0 and signal Dena–, and outputs the extracted errors to averaging circuit 616C. Flip-flops 615A, 615B, 615C latch signals Dena+, Dena0, Dena–, respectively, by one cycle of reference clock CLK, and outputs the latched signals Dena+, Dena0, Dena– to averaging circuits 616A, 616B, 616C, respectively.

Averaging circuit 616A calculates an average value of the errors between the sampling data in regions 11, 12, 15 and expected value E0, and outputs it to expected value operation unit 802. Averaging circuit 616B calculates an average value of the errors between the sampling data in regions 17, 18, 19 and expected value E0, and outputs it to expected value operation unit 802. Further, averaging circuit 616C calculates an average value of the errors between the sampling data in regions 13, 14, 16 and expected value E0, and outputs it to expected value operation unit 802.

In response, expected value operation unit 802 corrects expected values E+, E0, E– using the three average values input, and outputs the corrected expected values E+, E0, E– to Viterbi decoder 107.

As such, expected value correction circuit 108B extracts minimal errors from among errors D0 between the sampling data and expected value E0, and corrects expected values E+, E0, E– using the average values of the extracted errors.

Otherwise, the third embodiment is identical to the first embodiment.

According to the third embodiment, the optical disk apparatus is provided with the expected value correction circuit which corrects expected values in Viterbi decoding, including the one at the DC component level of the reproduction signal, in accordance with the amplitude of the reproduction signal. Thus, accurate Viterbi decoding is possible even if the DC component of the reproduction signal varies, and, as a result, accurate signal reproduction is ensured.

Fourth Embodiment

Figure 16:
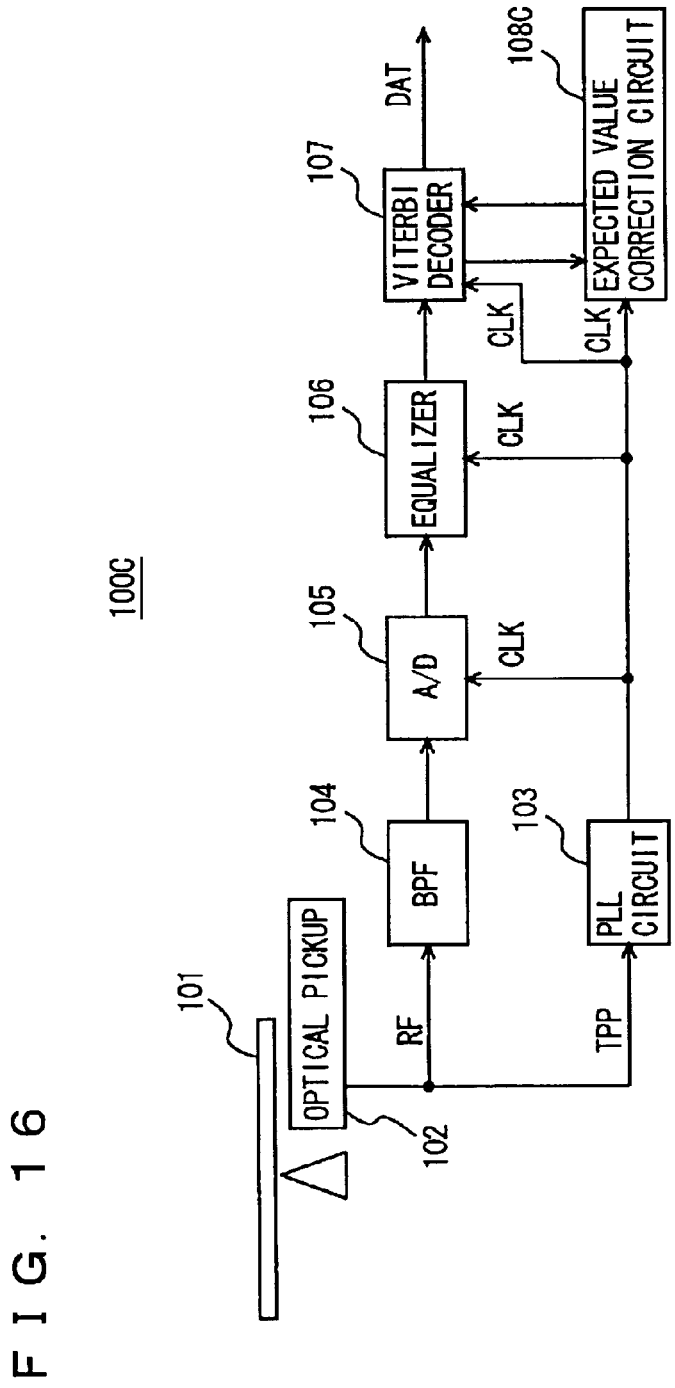
FIG. 16 is a schematic block diagram of the optical disk apparatus according to a fourth embodiment of the present invention.

Referring to FIG. 16, the optical disk apparatus 100C according to the fourth embodiment is identical to optical disk apparatus 100 except that expected value correction circuit 108 of optical disk apparatus 100 is replaced with an expected value correction circuit 108C.

Figure 17:
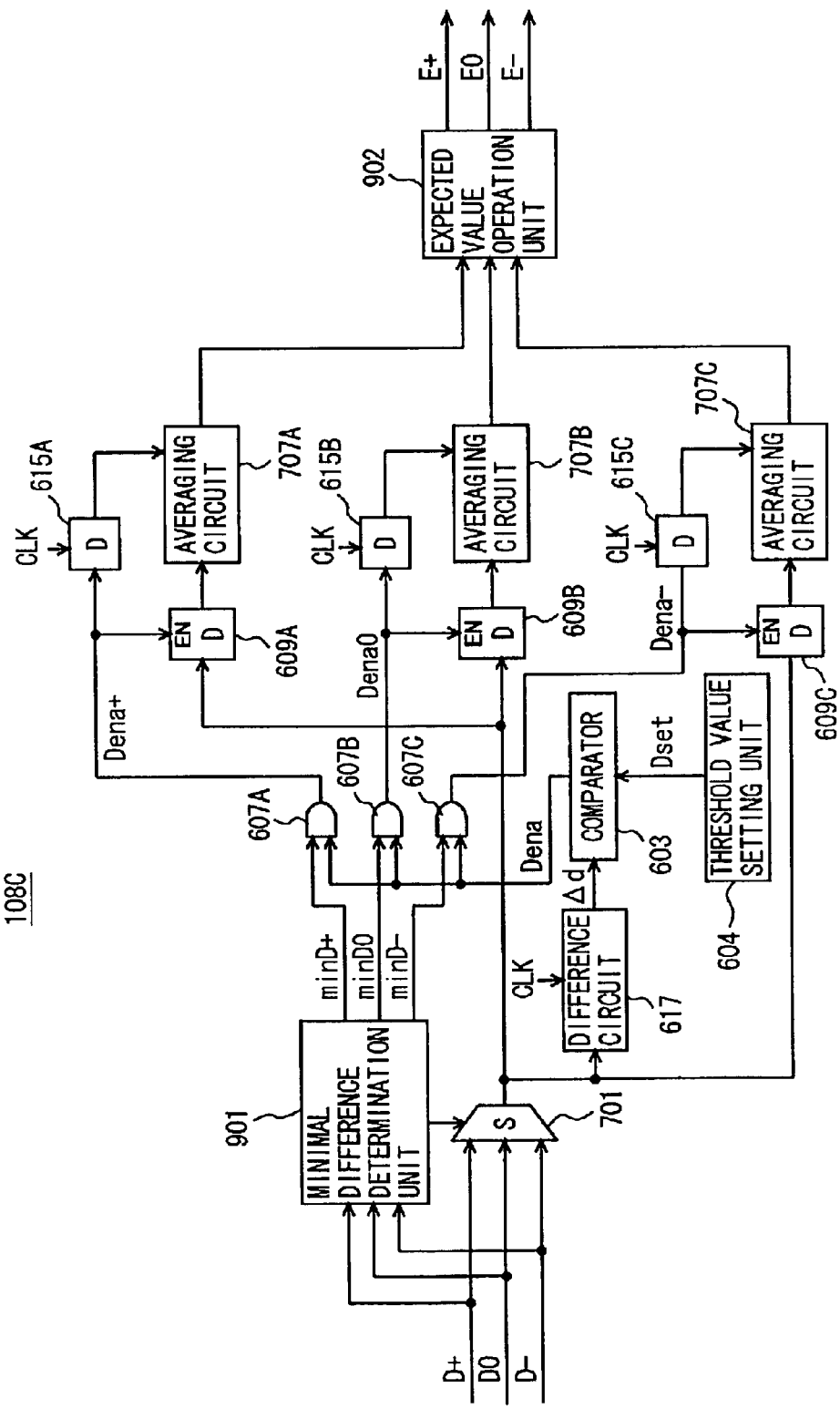
FIG. 17 is a circuit and block diagram of the expected value correction circuit shown in FIG. 16.

Referring to FIG. 17, the expected value correction circuit 108C includes a minimal difference determination unit 901, a selector 701, a difference circuit 617, a comparator 603, a threshold value setting unit 604, AND gates 607A, 607B, 607C, flip-flops 609A, 609B, 609C, 615A, 615B, 615C, averaging circuits 707A, 707B, 707C, and an expected value operation unit 902.

Comparator 603, threshold value setting unit 604, difference circuit 617, AND gates 607A, 607B, 607C, flip-flops 609A, 609B, 609C, 615A, 615B, 615C and selector 701 function as described above. Averaging circuits 707A, 707B, 707C each have the same circuit configuration as averaging circuit 707 shown in FIG. 12.

Minimal difference determination unit 901 determines which is the smallest among errors D+, D0, D– input from Viterbi decoder 107. When error D+ is the smallest, minimal difference determination unit 901 generates signal minD+ of an H level, a select signal for selecting error D+, and signals minD0, minD– of an L level. When error D0 is the smallest, minimal difference determination unit 901 generates signal minD0 of an H level, a select signal for selecting error D0, and signals minD+, minD– of an L level. Further, when error D– is the smallest, minimal difference determination unit 901 generates signal minD– of an H level, a select signal for selecting error D–, and signals minD+, minD0 of an L level.

Expected value operation unit 902 holds reference expected values for respective expected values E+, E0, E−, and corrects the expected values E+, E0, E− based on average values input. Expected value operation unit 902 then outputs the corrected expected values E+, E0, E− to Viterbi decoder 107.

An operation for correcting expected values E+, E0, E− in expected value correction circuit 108C is now described. When errors D+, D0, D− are input from Viterbi decoder 107, minimal difference determination unit 901 determines which is the smallest among the input errors D+, D0, D−, and generates signal minD+ of an H level, signals minD0, minD− of an L level and a select signal at the time when error D+ is the smallest. When error D0 is the smallest, the unit 901 generates signal minD0 of an H level, signals minD+, minD− of an L level and a select signal. When error D− is the smallest, it generates signal minD− of an H level, signals minD+, minD0 of an L level and a select signal.

Selector 701 selects either one of the errors D+, D0, D− based on the select signal from minimal difference determination unit 901, and outputs the selected error D+, D0 or D− to flip-flops 609A, 609B, 609C and difference circuit 617.

Difference circuit 617, as described above, calculates a difference of the input error D+, D0 or D− with that of one clock ago, and outputs an absolute value |Δd| of the calculated difference to comparator 603. Comparator 603 compares absolute value |Δd| with threshold value Dset, and generates signal Dena in the above-described manner. AND gate 607A carries out logical AND of signal minD+ and signal Dena, and outputs signal Dena+ to flip-flops 609A, 615A. AND gate 607B carries out logical AND of signal minD0 and signal Dena, and outputs signal Dena0 to flip-flops 609B, 615B. Further, AND gate 607C carries out logical AND of signal minD− and signal Dena, and outputs signal Dena− to flip-flops 609C, 615C.

In response, flip-flop 609A extracts errors between expected value E+ and the sampling data in regions 11, 12, 15 shown in FIG. 15 based on the input error D+ and signal Dena+, and outputs the extracted errors to averaging circuit 707A. Flip-flop 609B extracts errors between the sampling data in regions 17, 18, 19 and expected value E0 based on the input error D0 and signal Dena0, and outputs the extracted errors to averaging circuit 707B. Further, flip-flop 609C extracts errors between the sampling data in regions 13, 14, 16 and expected value E− based on the input error D− and signal Dena−, and outputs the extracted errors to averaging circuit 707C. Flip-flops 615A, 615B, 615C latch signals Dena+, Dena0, Dena−, respectively, by one cycle of reference clock CLK, and outputs the latched signals Dena+, Dena0, Dena− to averaging circuits 707A, 707B, 707C, respectively.

Averaging circuit 707A calculates an average value of the errors between the sampling data in regions 11, 12, 15 and expected value E+, and outputs it to expected value operation unit 902. Averaging circuit 707B calculates an average value of the errors between the sampling data in regions 17, 18, 19 and expected value E0, and outputs it to expected value operation unit 902. Further, averaging circuit 707C calculates an average value of the errors between the sampling data in regions 13, 14, 16 and expected value E−, and outputs it to expected value operation unit 902.

In response, expected value operation unit 902 corrects expected values E+, E0, E− using the three averaging values input, and outputs the corrected expected values E+, E0, E− to Viterbi decoder 107.

As such, expected value correction circuit 108C extracts minimal errors from among errors D+ between the sampling data and expected value E+, and corrects the expected value E+ using the average value of the extracted errors. It also extracts minimal errors from among errors D0 between the sampling data and expected value E0, and corrects the expected value E0 using the average value of the extracted errors. Further, it extracts minimal errors from among errors D− between the sampling data and expected value E−, and corrects the expected value E− using the average value of the extracted errors.

Otherwise, the present embodiment is identical to the first embodiment.

According to the fourth embodiment, the optical disk apparatus is provided with the expected value correction circuit which corrects the expected values in Viterbi decoding, including the expected value at the zero-cross point, in accordance with the amplitude of the reproduction signal. Thus, even if the DC component of the reproduction signal varies, the Viterbi decoding can be conducted accurately, and as a result, accurate signal reproduction is ensured.

Fifth Embodiment

Figure 18:
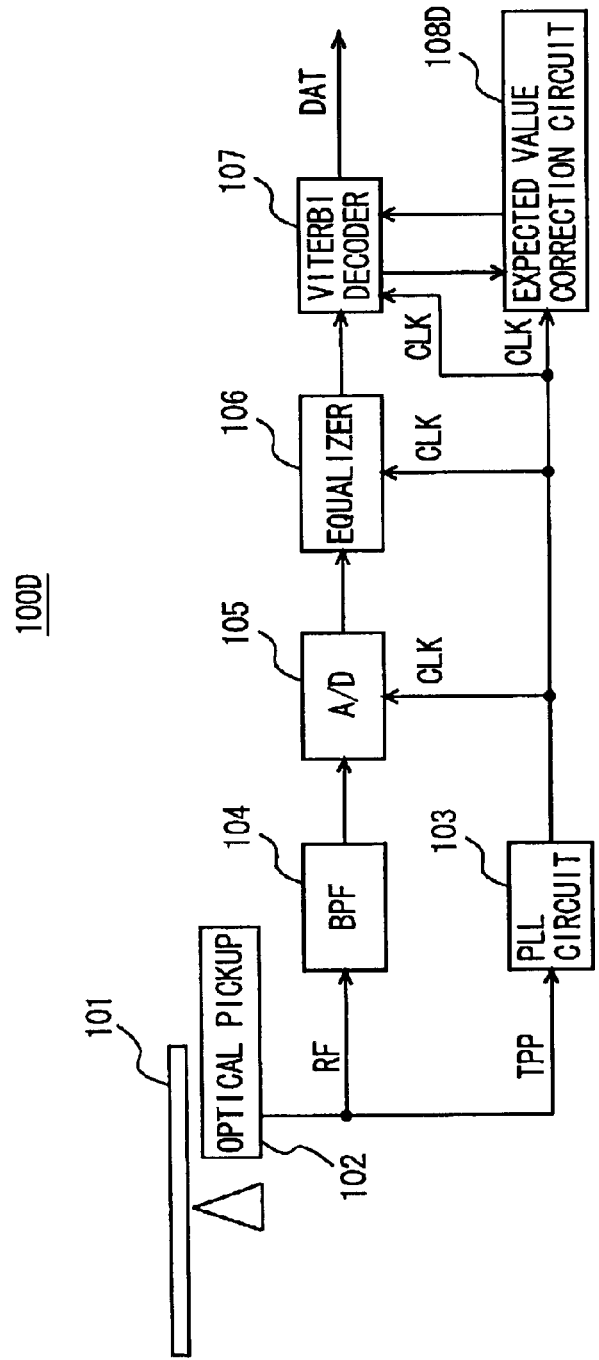
FIG. 18 is a schematic block diagram of the optical disk apparatus according to a fifth embodiment of the present invention.

Referring to FIG. 18, the optical disk apparatus 100D according to the fifth embodiment is identical to optical disk apparatus 100 except that expected value correction circuit 108 of optical disk apparatus 100 is replaced with an expected value correction circuit 108D.

Figure 19:
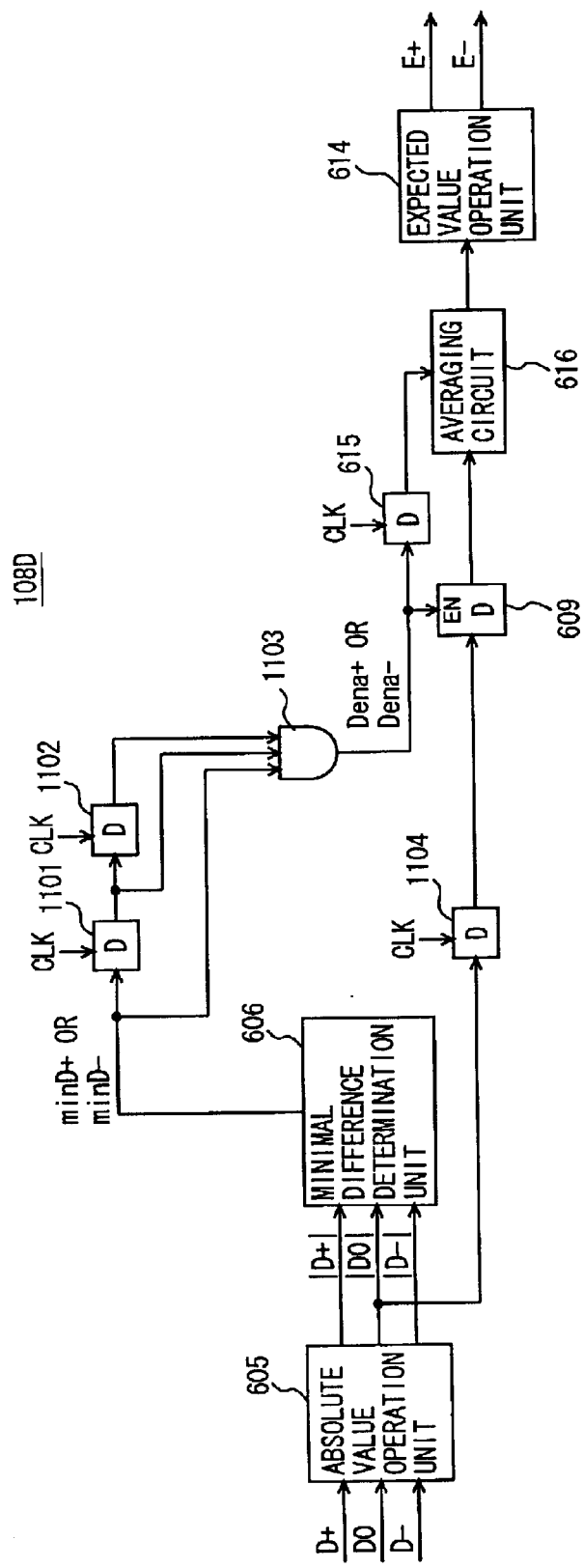
FIG. 19 is a circuit and block diagram of the expected value correction circuit shown in FIG. 18.

Referring to FIG. 19, the expected value correction circuit 108D includes an absolute value operation unit 605, a minimal difference determination unit 606, flip-flops 615, 609, 1101, 1102, 1104, an AND gate 1103, an averaging circuit 616, and an expected value operation unit 614.

Absolute value operation unit 605, minimal difference determination unit 606, flip-flops 609, 615, averaging circuit 616, and expected value operation unit 614 function as described above.

Flip-flop 1101 latches signal minD+ or minD− output from minimal difference determination unit 606 by one cycle of reference clock CLK, and outputs the latched signal minD+ or minD− to flip-flop 1102 and to AND gate 1103. Flip-flop 1102 further latches signal minD+ or minD− latched by flip-flop 1101 by one cycle of reference clock CLK, and outputs the latched signal minD+ or minD− to AND gate 1103.

AND gate 1103 receives three signals minD+ or minD− having their phases shifted by one cycle of reference clock CLK each, and carries out logical AND of the received three signals minD+ or minD− to generate signal Dena+ or Dena−. AND gate 1103 then outputs the generated signal Dena+ or Dena− to flip-flops 609, 615. The signals Dena+, Dena− generated by AND gate 1103 each have a time period being at an H level that is shorter than those of signals Dena+, Dena− in the first through fourth embodiments described above. Flip-flop 1104 latches absolute value |D0| from absolute value operation unit 605 by one cycle of reference clock CLK, and outputs the latched absolute value |D0| to flip-flop 609.

Figure 20:
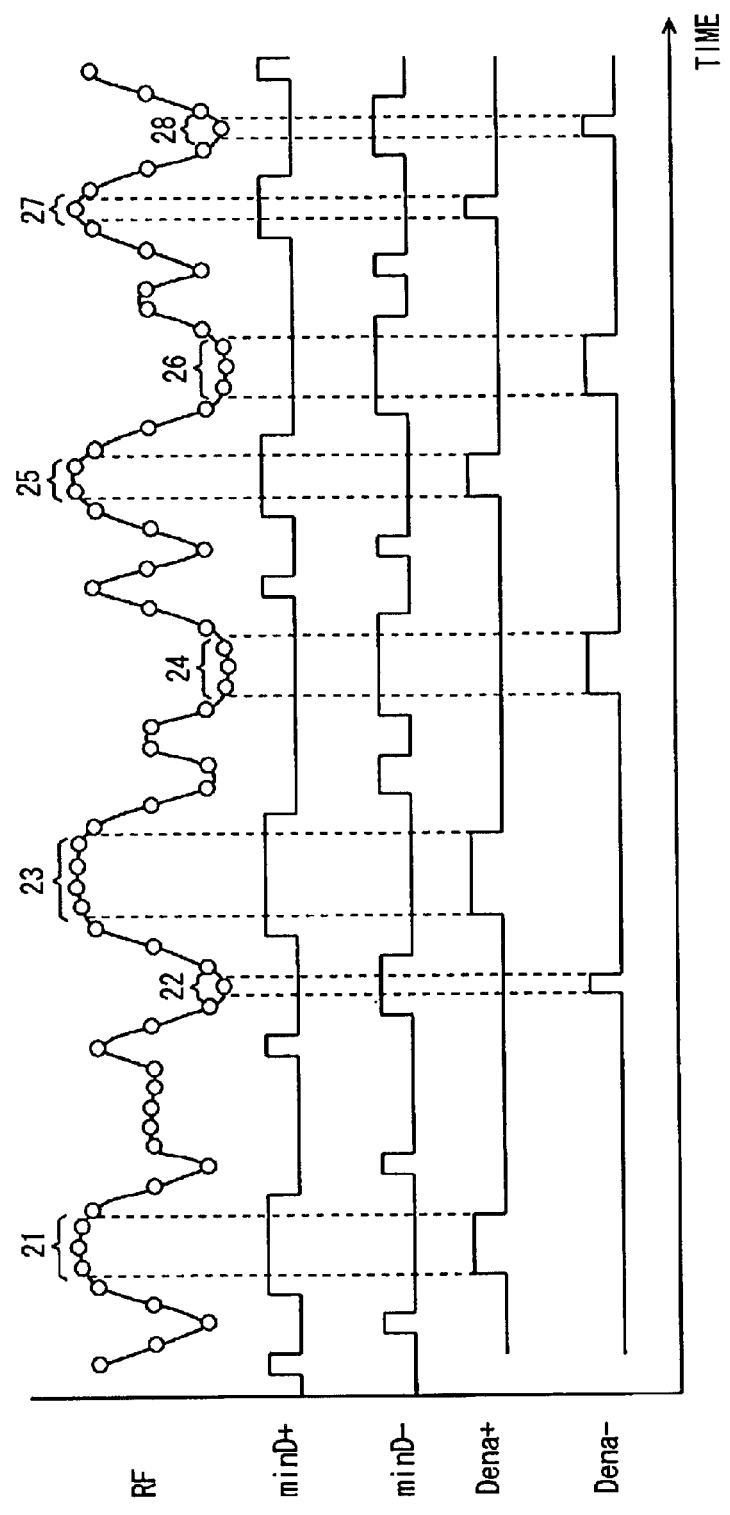
FIG. 20 is a signal timing chart illustrating an operation for correcting expected values in the expected value correction circuit shown in FIG. 19.

Referring to FIG. 20, a correcting operation of expected values E+, E0, E− in expected value correction circuit 108D is described. In receipt of errors D+, D0, D− from Viterbi decoder 107, absolute value operation unit 605 calculates absolute values of errors D+, D0, D−, and outputs the calculated absolute values |D+|, |D0|, |D−| to minimal difference determination unit 606, and also outputs absolute value |D0| to flip-flop 1104. Flip-flop 1104 latches absolute value |D0| by one cycle of reference clock CLK, and outputs the latched absolute value |D0| to flip-flop 609.

Minimal difference determination unit 606 determines which is the smallest among the input absolute values |D+|, |D0|, |D−|, and generates signal minD+ of an H level and signals minD0, minD− of an L level when absolute value |D+| is the smallest, generates signal minD0 of an H level and signals minD+, minD− of an L level when absolute value |D0| is the smallest, and generates signal minD− of an H level and signals minD+, minD0 of an L level when absolute value |D−| is the smallest. Minimal difference determination unit 606 then outputs the generated signal minD+ or minD− to flip-flop 1101 and to AND gate 1103.

Flip-flop 1101 latches signal minD+ or minD− by one cycle of reference clock CLK, and outputs the latched signal minD+ or minD− to flip-flop 1102. Flip-flop 1102 further latches the input signal minD+ or minD− by one cycle of reference clock CLK, and outputs the latched signal minD+ or minD− to AND gate 1103. In response, AND gate 1103 carries out logical AND of three signals minD+ or minD− with their phases shifted by one cycle of reference clock CLK each to generate signal Dena+ or Dena−, and outputs the generated signal Dena+ or Dena− to flip-flops 609, 615.

In response, flip-flop 609 extracts absolute values |D0| input from flip-flop 1104 in a time period where signal Dena+ or Dena− is at an H level. More specifically, flip-flop 609 extracts the absolute values of the amplitude values in regions 21–28, and outputs the extracted absolute values to averaging circuit 616. Flip-flop 615 latches signal Dena+ or Dena− by one cycle of reference clock CLK, and outputs the latched signal Dena+ or Dena− to averaging circuit 616. Averaging circuit 616 averages the absolute values input from flip-flop 609 in the above-described manner, and outputs an average value of the averaged absolute values to expected value operation unit 614. Expected value operation unit 614 makes correction of the expected values by designating the input average value as the corrected expected value E+, and the input average value with its sign inverted as the corrected expected value E−. Expected value operation unit 614 then outputs the corrected expected values E+, E− to Viterbi decoder 107.

As such, expected value correction circuit 108D corrects the expected values using the amplitude values that have less variation than those used for correction of expected values by expected value correction circuit 108.

Although logical AND of three signals minD+ or minD− having their phases shifted by one cycle of reference clock CLK each has been carried out in the above description, the present embodiment is not limited thereto. All that is needed is to perform logical AND of at least two signals minD+ or minD− with their phases shifted by one clock each.

Otherwise, the fifth embodiment is identical to the first embodiment.

According to the fifth embodiment, the optical disk apparatus is provided with the expected value correction circuit which corrects expected values in Viterbi decoding in accordance with the amplitude of the reproduction signal, using the sampling data in the region where the data exhibits less variation. This enables more reliable correction of expected values, leading to more accurate Viterbi decoding. As a result, accurate signal reproduction is ensured.

Sixth Embodiment

Figure 21:
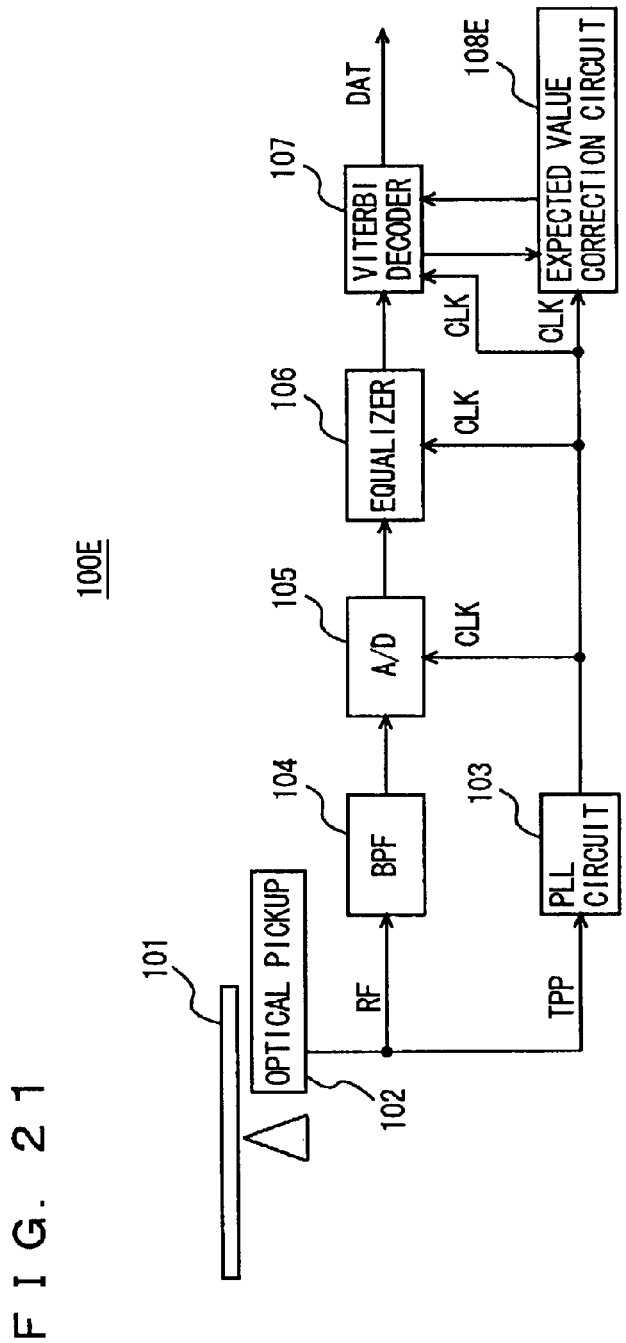
FIG. 21 is a schematic block diagram of the optical disk apparatus according to a sixth embodiment of the present invention.

Referring to FIG. 21, the optical disk apparatus 100E according to the sixth embodiment is identical to optical disk apparatus 100A except that expected value correction circuit 108A of optical disk apparatus 100A is replaced with an expected value correction circuit 108E.

Figure 22:
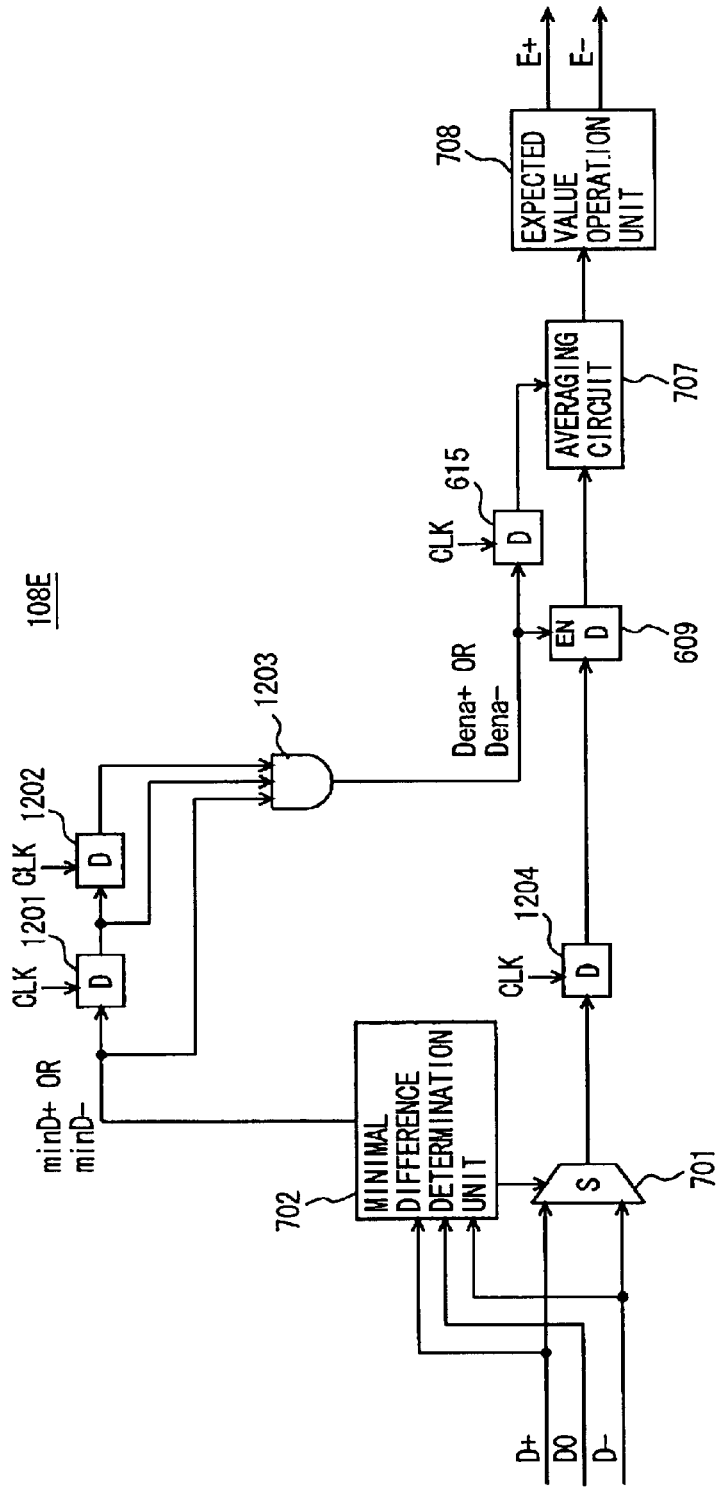
FIG. 22 is a circuit and block diagram of the expected value correction circuit shown in FIG. 21.

Referring to FIG. 22, the expected value correction circuit 108E differs from expected value correction circuit 108A only in that comparator 603, threshold value setting circuit 604 and difference circuit 617 have been removed therefrom, and flip-flops 1201, 1202, 1204 and an AND gate 1203 have been added thereto.

Flip-flop 1201 latches signal minD+ or minD− output from minimal difference determination unit 702 by one cycle of reference clock CLK, and outputs the latched signal minD+ or minD− to flip-flop 1202 and to AND gate 1203. Flip-flop 1202 further latches signal minD+ or minD− output from flip-flop 1201 by one cycle of reference clock CLK, and outputs the latched signal minD+ or minD− to AND gate 1203.

AND gate 1203 carries out logical AND of three signals minD+ or minD− having their phases shifted by one cycle of reference clock CLK each to generate signal Dena+ or Dena−, and outputs the generated signal Dena+ or Dena− to flip-flops 609, 615.

An operation for correcting expected values E+, E− in expected value correction circuit 108E is now described. Minimal difference determination unit 702 determines which is the smallest among the input errors D+, D0, D−, and generates signal minD+ or minD− and a select signal, as described above. It then outputs the signal minD+ or minD− to flip-flop 1201 and to AND gate 1203, and outputs the select signal to selector 701. Selector 701 selects error D+ or D− based on the select signal from minimal difference determination unit 702, and outputs it to flip-flop 1204.

Flip-flop 1204 latches the input error D+ or D− by one cycle of reference clock CLK, and outputs the latched error D+ or D− to flip-flop 609.

Flip-flop 1201 latches the input signal minD+ or minD− by one cycle of reference clock CLK, and outputs the latched signal minD+ or minD− to flip-flop 1202 and to AND gate 1203. Flip-flop 1202 further latches the input signal minD+ or minD− by one cycle of reference clock CLK, and outputs the latched signal minD+ or minD− to AND gate 1203. AND gate 1203 carries out logical AND of three signals minD+ or minD− having their phases shifted by one cycle of reference clock CLK each, and generates signal Dena+ or Dena− to output to flip-flops 609, 615.

In response, flip-flop 609 extracts errors D+ or D−, selected by selector 701, in a time period where signal Dena+ or Dena− is at an H level, and outputs the extracted errors to averaging circuit 707.

Flip-flop 615 latches signal Dena+ or Dena− by one cycle of reference clock CLK, and outputs the latched signal Dena+ or Dena− to averaging circuit 707. In response, averaging circuit 707 calculates an average value of the errors D+ or D− in the above-described manner, and outputs the calculated average value to expected value operation unit 708. Expected value operation unit 708 corrects the expected values E+, E− based on the average value received from averaging circuit 707 in the above-described manner, and outputs the corrected expected values E+, E− to Viterbi decoder 107.

As such, expected value correction circuit 108E extracts the errors between the sampling data of reproduction signal RF in regions 21–28 shown in FIG. 20 and the expected values, and calculates the average value of the extracted errors for correction of expected values E+, E−. Regions 21–28 are narrower than regions 11–16 shown in FIG. 10. Expected value correction circuit 108E extracts the errors between expected values E+, E− and the sampling data of the reproduction signal in the regions where the data exhibit less variation than in the case of expected value correction circuit 108A, and uses the extracted errors to correct expected values E+, E−.

Although execution of logical AND of three signals minD+ or minD− having their phases shifted by one cycle of reference clock CLK each has been described above, the present embodiment is not limited thereto. All that is needed is execution of logical AND of at least two signals minD+ or minD− with their phases shifted by one clock of reference clock CLK each.

Otherwise, the sixth embodiment is identical to the second embodiment.

According to the sixth embodiment, the optical disk apparatus is provided with the expected value correction circuit which corrects the expected values in Viterbi decoding in accordance with the amplitude of the reproduction signal, employing the errors of the sampling data in the regions where the data exhibit less variation. Accordingly, more reliable correction of expected values, and hence, more accurate Viterbi decoding becomes possible, and as a result, accurate signal reproduction is ensured.

Seventh Embodiment

Figure 23:
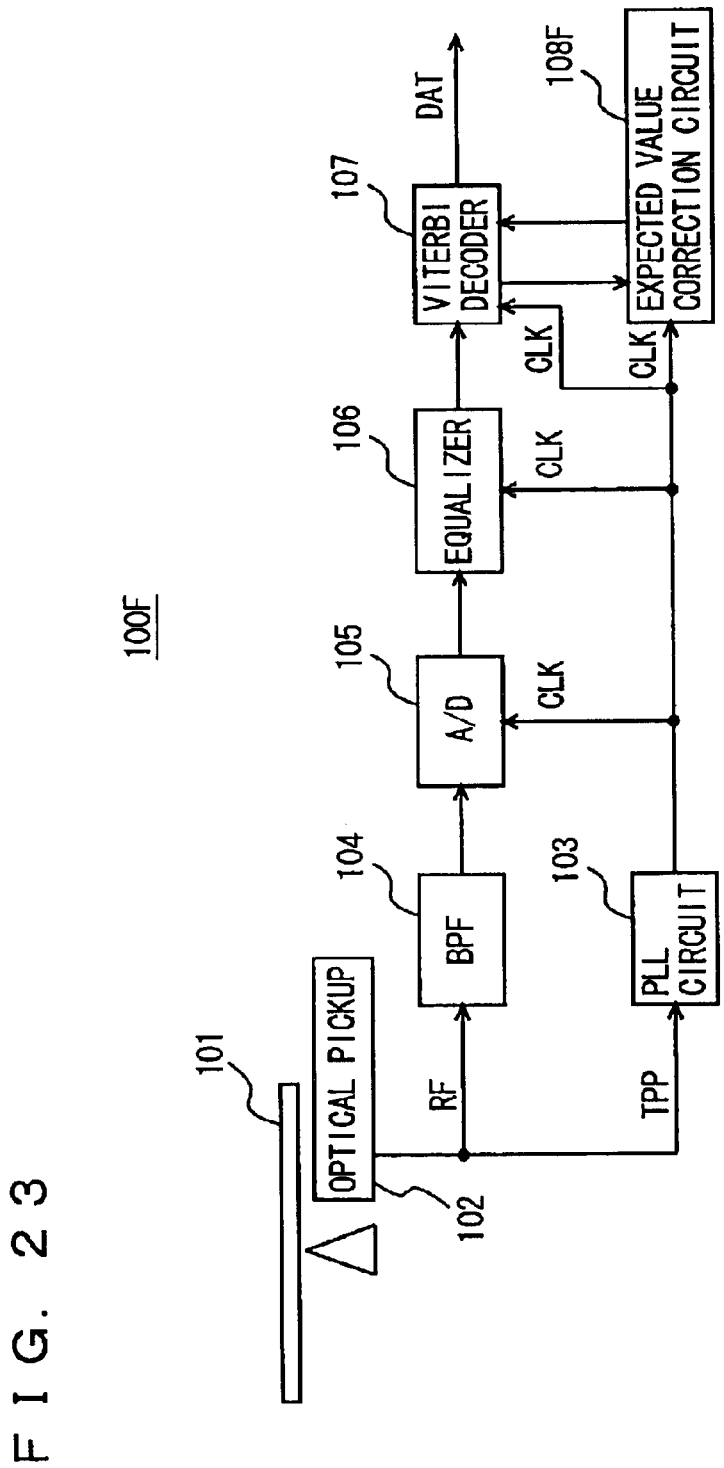
FIG. 23 is a schematic block diagram of the optical disk apparatus according to a seventh embodiment of the present invention.

Referring to FIG. 23, the optical disk apparatus 100F according to the seventh embodiment is identical to optical disk apparatus 100B except that expected value correction circuit 108B of optical disk apparatus 100B is replaced with an expected value correction circuit 108F.

Figure 24:
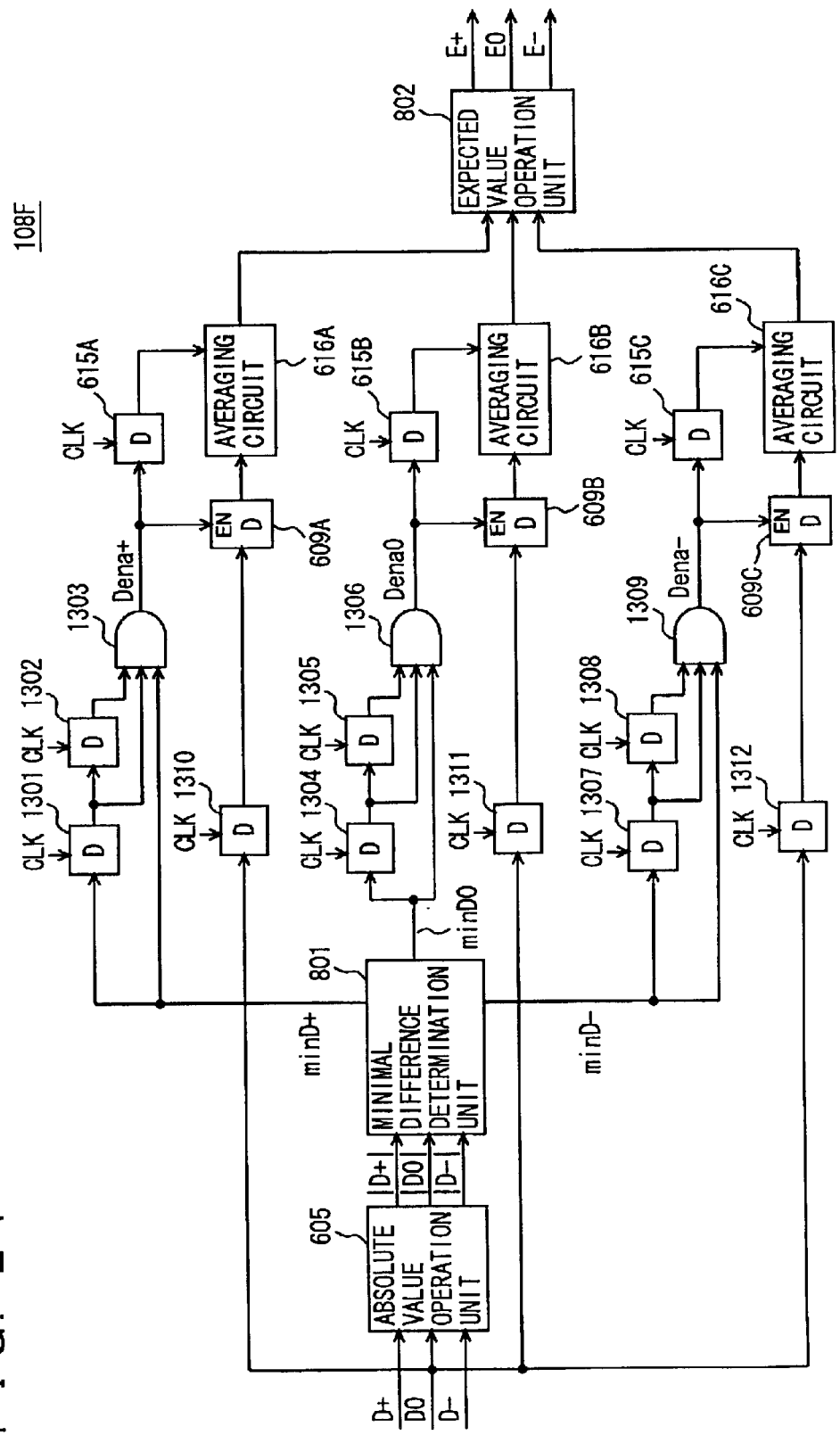
FIG. 24 is a circuit and block diagram of the expected value correction circuit shown in FIG. 23.

Referring to FIG. 24, the expected value correction circuit 108F differs from expected value correction circuit 108B only in that comparator 603, threshold value setting unit 604 and difference circuit 617 have been removed therefrom and flip-flops 1301, 1302, 1310, 1304, 1305, 1311, 1307, 1308, 1312 and AND gates 1303, 1306, 1309 have been added thereto.

Flip-flop 1301 latches signal minD+ from minimal difference determination unit 801 by one cycle of reference clock CLK, and outputs the latched signal minD+ to flip-flop 1302 and to AND gate 1303. Flip-flop 1302 further latches the signal minD+ from flip-flop 1301 by one cycle of reference clock CLK, and outputs the latched signal minD+ to AND gate 1303.

AND gate 1303 carries out logical AND of the three signals minD+ having their phases shifted by one cycle of reference clock CLK each to generate signal Dena+, and outputs the generated signal Dena+ to flip-flops 609A,615A.

Flip-flop 1304 latches signal minD0 from minimal difference determination unit 801 by one cycle of reference clock CLK, and outputs the latched signal minD0 to flip-flop 1305 and to AND gate 1306. Flip-flop 1305 further latches signal minD0 from flip-flop 1304 by one cycle of reference clock CLK, and outputs the latched signal minD0 to AND gate 1306.

AND gate 1306 carries out logical AND of the three signals minD0 with their phases shifted by one cycle of reference clock CLK each to generate signal Dena0, and outputs the generated signal Dena0 to flip-flops 609B, 615B.

Flip-flop 1307 latches signal minD− from minimal difference determination unit 801 by one cycle of reference clock CLK, and outputs the latched signal minD− to flip-flop 1308 and to AND gate 1309. Flip-flop 1308 further latches minD− from flip-flop 1307 by one cycle of reference clock CLK, and outputs the latched signal minD− to AND gate 1309.

AND gate 1309 carries out logical AND of the three signals minD− having their phases shifted by one cycle of reference clock CLK each to generate signal Dena−, and outputs the generated signal Dena− to flip-flops 609C, 615C.

Flip-flop 1310 latches error D0 by one cycle of reference clock CLK and outputs the latched error D0 to flip-flop 609A. Flip-flop 1311 latches error D0 by one cycle of reference clock CLK and outputs the latched error D0 to flip-flop 609B. Flip-flop 1312 latches error D0 by one cycle of reference clock CLK and outputs the latched error D0 to flip-flop 609C.

Figure 25:
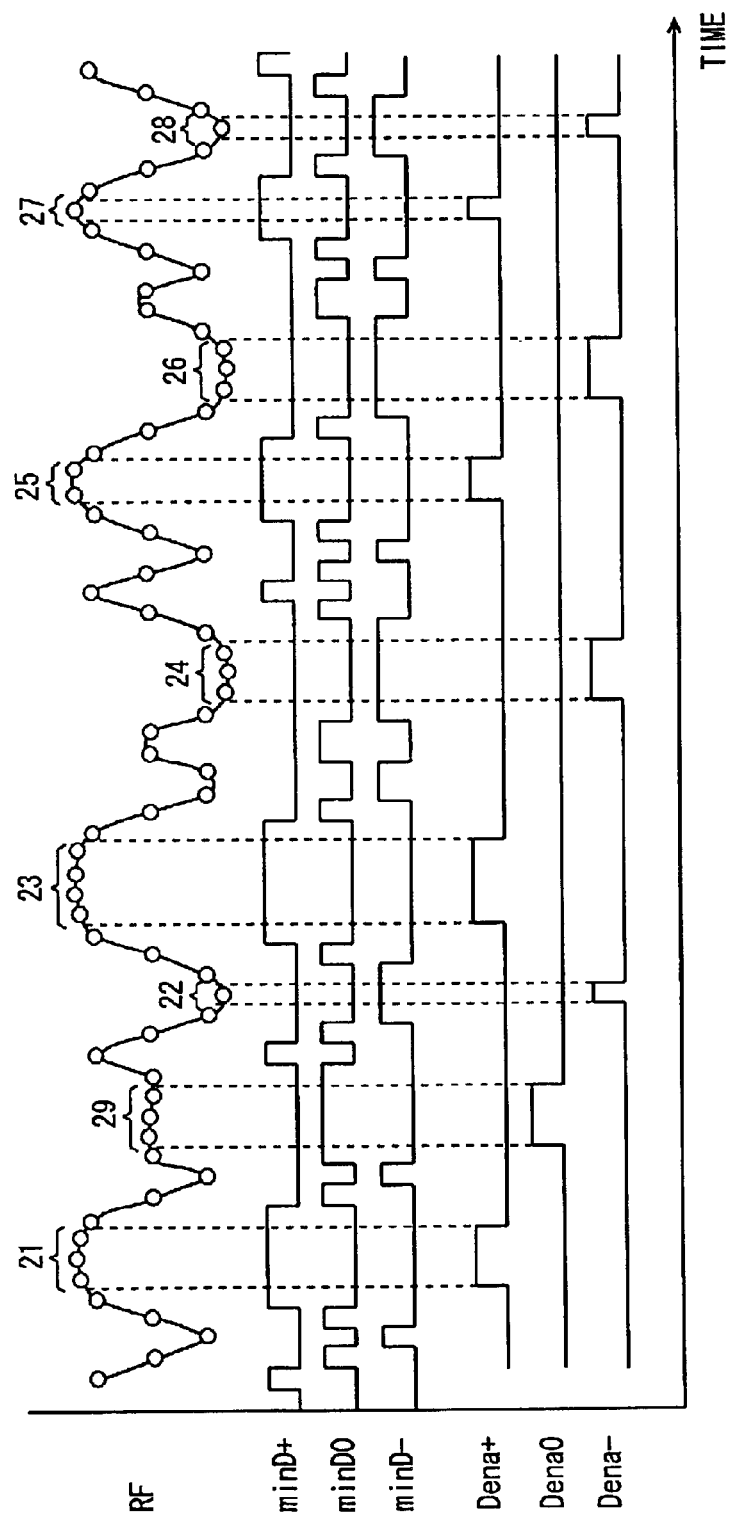
FIG. 25 is a signal timing chart illustrating an operation for correcting expected values in the expected value correction circuit shown in FIG. 24.

Referring to FIG. 25, an operation for correcting expected values E+, E0, E− in expected value correction circuit 108F is described. When errors D+, D0, D− are input from Viterbi decoder 107, absolute value operation unit 605 calculates absolute values of errors D+, D0, D−, and outputs the absolute values |D+|, |D0|, |D−| to minimal difference determination unit 801. Minimal difference determination unit 801 determines which is the smallest among the received absolute values |D+|, |D0|, |D−|, and generates signal minD+ of an H level and signals minD0, minD− of an L level when absolute value |D+| is the smallest, generates signal minD0 of an H level and signals minD+, minD− of an L level when absolute value |D0| is the smallest, and generates signal minD− of an H level and signals minD+, minD0 of an L level when absolute value |D−| is the smallest.

Flip-flop 1301 latches the input signal minD+ by one cycle of reference clock CLK, and outputs the latched signal minD+ to flip-flop 1302 and to AND gate 1303. Flip-flop 1302 further latches the received signal minD+ by one cycle of reference clock CLK, and outputs the latched signal minD+ to AND gate 1303. AND gate 1303 carries out logical AND of the three signals minD+ having their phases shifted by one cycle of reference clock CLK each to generate signal Dena+, and outputs the generated signal Dena+ to flip-flops 609A, 615A.

Flip-flop 1304 latches the input signal minD0 by one cycle of reference clock CLK, and outputs the latched signal minD0 to flip-flop 1305 and to AND gate 1306. Flip-flop 1305 further latches the input signal minD0 by one cycle of reference clock CLK, and outputs the latched signal minD0 to AND gate 1306. AND gate 1306 carries out logical AND of the three signals minD0 having their phases shifted by one cycle of reference clock CLK each to generate signal Dena0, and outputs the generated signal Dena0 to flip-flops 609B, 615B.

Further, flip-flop 1307 latches the input signal minD− by one cycle of reference clock CLK, and outputs the latched signal minD− to flip-flop 1308 and to AND gate 1309. Flip-flop 1308 further latches the input signal minD− by one cycle of reference clock CLK, and outputs the latched signal minD− to AND gate 1309. AND gate 1309 carries out logical AND of the three signals minD− with their phases shifted by one cycle of reference clock CLK each to generate signal Dena−, and outputs the generated signal Dena− to flip-flops 609C, 615C.

Flip-flop 1310 latches error D0 by one cycle of reference clock CLK, and outputs the latched error D0 to flip-flop 609A. Flip-flop 1311 latches error D0 by one cycle of reference clock CLK, and outputs the latched error D0 to flip-flop 609B. Flip-flop 1312 latches error D0 by one cycle of reference clock CLK, and outputs the latched error D0 to flip-flop 609C.

In response, flip-flop 609A extracts errors between expected value E0 and sampling data in regions 21, 23, 25, 27 based on the input error D0 and signal Dena+, and outputs the extracted errors to averaging circuit 616A. Flip-flop 609B extracts errors between expected value E0 and sampling data in region 29 based on the input error D0 and signal Dena0, and outputs the extracted errors to averaging circuit 616B. Further, flip-flop 609C extracts errors between expected value E0 and sampling data in regions 22, 24, 26, 28 based on the input error D0 and signal Dena−, and outputs the extracted errors to averaging circuit 616C. Flip-flips 615A, 615B, 615C latch signals Dena+, Dena0, Dena−, respectively, by one cycle of reference clock CLK, and output the latched signals Dena+, Dena0, Dena− to averaging circuits 616A, 616B, 616C, respectively.

Averaging circuit 616A calculates an average value of the errors between the sampling data in regions 21, 23, 25, 27 and expected value E0, and outputs the average value to expected value operation unit 802. Averaging circuit 616B calculates an average value of the errors between the sampling data in region 29 and expected value E0, and outputs the average value to expected value operation unit 802. Further, averaging circuit 616C calculates an average value of the errors between the sampling data in regions 22, 24, 26, 28 and expected value E0, and outputs the average value to expected value operation unit 802.

In response, expected value operation unit 802 corrects expected values E+, E0, E− using the received three average values, and outputs the corrected expected values E+, E0, E− to Viterbi decoder 107.

As such, expected value correction circuit 108F extracts errors D+ between the sampling data and expected value E+ in the regions where variation is less obvious, and uses the average value of the extracted errors to correct the expected value E+. Likewise, it extracts errors D0 between the sampling data and expected value E0 in the region(s) with less variation, and uses the average value of the extracted errors to correct the expected value E0. It further extracts errors D− between the sampling data and expected value E− in the regions where variation is less obvious, and uses the average value of the extracted errors to correct the expected value E−.

Although logical AND of three signals minD+, three signals minD0 and three signals minD− with their phases shifted by one cycle of reference clock CLK each has been carried out in the above description, the present embodiment is not limited thereto. All that is needed is execution of logical AND of at least two signals minD+, at least two signals minD0 and at least two signals minD− with their phases shifted by one clock each.

Otherwise, the seventh embodiment is identical to the third embodiment.

According to the seventh embodiment, the optical disk apparatus is provided with the expected value correction circuit which corrects the expected values in the Viterbi decoding, including the one at the zero-cross point, using the errors between the expected values and the sampling data in the regions where the data exhibit less variation. Thus, more reliable correction of expected values becomes possible, and accurate Viterbi decoding is permitted even if the DC component of the reproduction signal varies. As a result, accurate signal reproduction is ensured.

Eighth Embodiment

Figure 26:
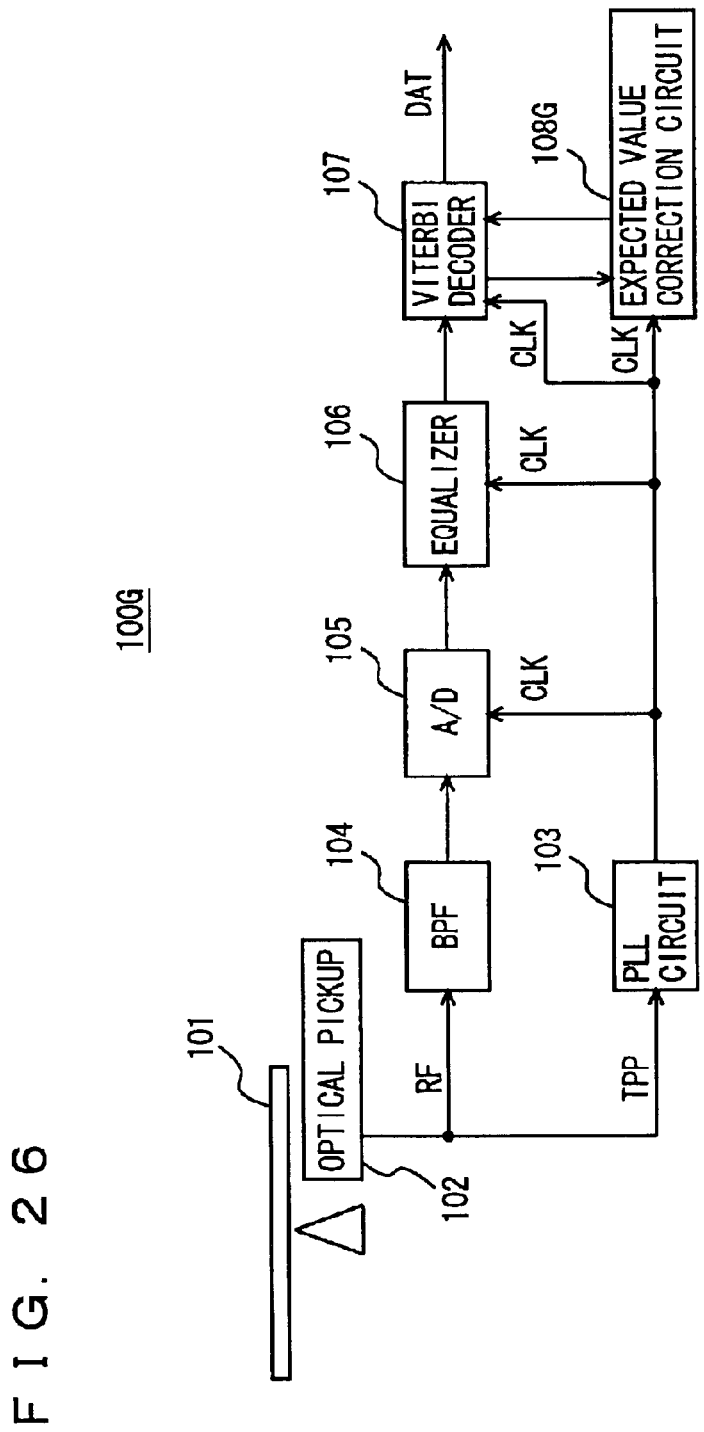
FIG. 26 is a schematic block diagram of the optical disk apparatus according to an eighth embodiment of the present invention.

Referring to FIG. 26, the optical disk apparatus 100G according to the eighth embodiment is identical to optical disk apparatus 100C except that expected value correction circuit 108C of optical disk apparatus 100C is replaced with an expected value correction circuit 108G.

Figure 27:
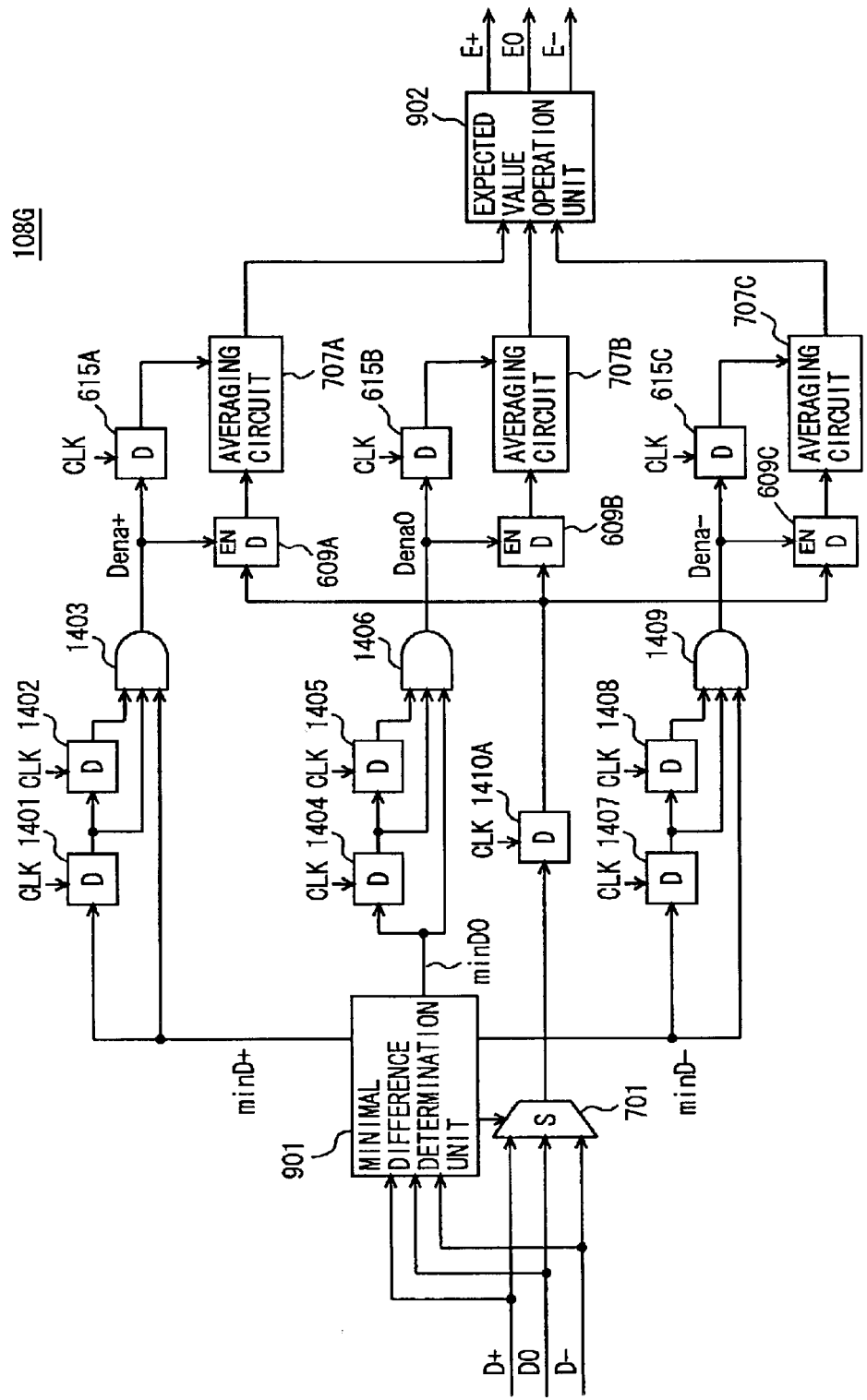
FIG. 27 is a circuit and block diagram of the expected value correction circuit shown in FIG. 26.

Referring to FIG. 27, the expected value correction circuit 108G differs from expected value correction circuit 108C only in that comparator 603, threshold value setting unit 604 and difference circuit 617 have been removed therefrom and flip-flops 1401, 1402, 1404, 1405, 1410A, 1407, 1408 and AND gates 1403, 1406, 1409 have been added thereto.

Flip-flop 1401 latches signal minD+ from minimal difference determination unit 901 by one cycle of reference clock CLK, and outputs the latched signal minD+ to flip-flop 1402 and to AND gate 1403. Flip-flop 1402 further latches the signal minD+ from flip-flop 1401 by one cycle of reference clock CLK, and outputs the latched signal minD+ to AND gate 1403.

AND gate 1403 carries out logical AND of the three signals minD+ with their phases shifted by one cycle of reference clock CLK each to generate signal Dena+, and outputs the generated signal Dena+ to flip-flops 609A, 615A.

Flip-flop 1404 latches signal minD0 from minimal difference determination unit 901 by one cycle of reference clock CLK, and outputs the latched signal minD0 to flip-flop 1405 and to AND gate 1406. Flip-flop 1405 further latches the signal minD0 from flip-flop 1404 by one cycle of reference clock CLK, and outputs the latched signal minD0 to AND gate 1406.

AND gate 1406 carries out logical AND of the three signals minD0 with their phases shifted by one cycle of reference clock CLK each to generate signal Dena0, and outputs the generated signal Dena0 to flip-flops 609B, 615B.

Flip-flop 1407 latches signal minD− from minimal difference determination unit 901 by one cycle of reference clock CLK, and outputs the latched signal minD− to flip-flop 1408 and to AND gate 1409. Flip-flop 1408 further latches the signal minD− from flip-flop 1407 by one cycle of reference clock CLK, and outputs the latched signal minD− to AND gate 1409.

AND gate 1409 carries out logical AND of the three signals minD− with their phases shifted by one cycle of reference clock CLK each to generate signal Dena−, and outputs the generated signal Dena− to flip-flops 609C, 615C.

Flip-flop 1410A latches error D+, D0 or D− received from selector 701 by one cycle of reference clock CLK, and outputs the latched error D+, D0 or D− to flip-flops 609A, 609B, 609C.

A correcting operation of expected values E+, E0, E− in expected value correction circuit 108G is now described. In receipt of errors D+, D0, D− from Viterbi decoder 107, minimal difference determination unit 901 determines which is the smallest among the input errors D+, D0, D−. When error D+ is the smallest, the unit 901 generates signal minD+ of an H level, signals minD0, minD− of an L level, and a select signal for selecting error D+. When error D0 is the smallest, it generates signal minD0 of an H level, signals minD+, minD− of an L level, and a select signal for selecting error D0. When error D− is the smallest, it generates signal minD− of an H level, signals minD+, minD0 of an L level, and a select signal for selecting error D−.

Selector 701 selects one of errors D+, D0, D− based on the select signal from minimal difference determination unit 901, and outputs the selected error D+, D0 or D− to flip-flop 1410A.

Flip-flop 1401 latches input signal minD+ by one cycle of reference clock CLK, and outputs the latched signal minD+ to flip-flop 1402 and to AND gate 1403. Flip-flop 1402 further latches the input signal minD+ by one cycle of reference clock CLK, and outputs the latched signal minD+ to AND gate 1403. AND gate 1403 carries out logical AND of the three signals minD+ with their phases shifted by one cycle of reference clock CLK each to generate signal Dena+, and outputs the generated signal Dena+ to flip-flops 609A, 615A.

Flip-flop 1404 latches input signal minD0 by one cycle of reference clock CLK, and outputs the latched signal minD0 to flip-flop 1405 and to AND gate 1406. Flip-flop 1405 further latches the input signal minD0 by one cycle of reference clock CLK, and outputs the latched signal minD0 to AND gate 1406. AND gate 1406 carries out logical AND of the three signals minD0 with their phases shifted by one cycle of reference clock CLK each to generate signal Dena0, and outputs the generated signal Dena0 to flip-flops 609B, 615B.

Further, flip-flop 1407 latches input signal minD− by one cycle of reference clock CLK, and outputs the latched signal minD− to flip-flop 1408 and to AND gate 1409. Flip-flop 1408 further latches the input signal minD− by one cycle of reference clock CLK, and outputs the latched signal minD− to AND gate 1409. AND gate 1409 carries out logical AND of the three signals minD− having their phases shifted by one cycle of reference clock CLK each to generate signal Dena−, and outputs the generated signal Dena− to flip-flops 609C, 615C.

Flip-flop 1410A latches one of the errors D+, D0, D− received from selector 701 by one cycle of reference clock CLK, and outputs the latched error D+, D0 or D− to flip-flops 609A, 609B, 609C.

In response, flip-flop 609A extracts errors between expected value E+ and sampling data in regions 21, 23, 25, 27 shown in FIG. 25 based on input error D+ and signal Dena+, and outputs the extracted errors to averaging circuit 707A. Flip-flop 609B extracts errors between expected value E0 and sampling data in region 29 based on input error D0 and signal Dena0, and outputs the extracted errors to averaging circuit 707B. Further, flip-flop 609C extracts errors between expected value E− and sampling data in regions 22, 24, 26, 28 based on input error D− and signal Dena−, and outputs the extracted errors to averaging circuit 707C. In this case, although flip-flop 1410A outputs one of the errors D+, D0, D− to flip-flops 609A, 609B and 609C, each flip-flop 609A, 609B, 609C is activated only when corresponding signal Dena+, Dena0, Dena− is at an H level. Thus, flip-flop 609A outputs the errors between expected value E+ and the sampling data in regions 21, 23, 25, 27, flip-flop 609B outputs the errors between expected value E0 and the sampling data in region 29, and flip-flop 609C outputs the errors between expected value E− and the sampling data in regions 22, 24, 26, 28.

Flip-flops 615A, 615B, 615C latch signals Dena+, Dena0, Dena−, respectively, by one cycle of reference clock CLK, and output the latched signals Dena+, Dena0, Dena− to averaging circuits 707A, 707B, 707C, respectively.

Averaging circuit 707A calculates an average value of the errors between expected value E+ and the sampling data in regions 21, 23, 25, 27, and outputs the average value to expected value operation unit 902. Averaging circuit 707B calculates an average value of the errors between expected value E0 and the sampling data in region 29, and outputs the average value to expected value operation unit 902. Further, averaging circuit 707C calculates an average value of the errors between expected value E− and the sampling data in regions 22, 24, 26, 28, and outputs the average value to expected value operation unit 902.

In response, expected value operation unit 902 corrects expected values E+, E0, E− using the input three average values, and outputs the corrected expected values E+, E0, E− to Viterbi decoder 107.

Although logical AND of three signals minD+, three signals minD0 and three signals minD− with their phases shifted by one cycle of reference clock CLK each has been carried out in the above description, the eighth embodiment is not limited thereto. All that is needed is to perform logical AND of at least two signals minD+, at least two signals minD0 and at least two signals minD− with their phases shifted by one clock each.

Otherwise, the present embodiment is identical to the fourth embodiment.

According to the eighth embodiment, the optical disk apparatus is provided with the expected value correction circuit which corrects the expected values in the Viterbi decoding, including the one at the zero-cross point, using the errors between the expected values and the sampling data in the regions where the data exhibit less variation. Thus, more reliable correction of the expected values becomes possible, and Viterbi decoding is performed accurately even if the DC component of the reproduction signal varies. As a result, accurate signal reproduction is ensured.

In each embodiment above, correction of expected values in Viterbi decoding has been described taking signal reproduction from a magneto-optical disk as an example. However, the present invention is not limited thereto, but rather is applicable to signal reproduction from a phase change disk and an optical disk like DVD, and is generally applicable to any optical disk apparatus which reproduces signals by Viterbi decoding.

Further, in each embodiment above, Viterbi decoder 107 has made correction of the expected values by outputting errors D+, D0, D− to corresponding expected value correction circuit 108, 108A, 108B, 108C, 108D, 108E, 108F or 108G. However, the signals for use in correcting the expected values only need to be error components, and Viterbi decoder 107 may output branch metrics BM+, BM0, BM−, for example, to corresponding expected value correction circuit 108, 108A, 108B, 108C, 108D, 108E, 108F or 108G.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An optical disk apparatus comprising:
   an optical pickup irradiating laser light onto an optical disk and detecting reflected light thereof;
   a sampling circuit sampling a reproduction signal detected by said optical pickup in synchronization with a reference clock and outputting sampling values;
   an expected value correction circuit correcting an expected value for use in converting said sampling value from multilevel data to binary data using the sampling values in a region where variation is small; and
   a Viterbi decoding circuit converting said sampling value from multilevel data to binary data such that an error between the corrected expected value input from said expected value correction circuit and said sampling value becomes small.

2. The optical disk apparatus according to claim 1, wherein
   said Viterbi decoding circuit calculates an error between said sampling value and an expected value and outputs the error to said expected value correction circuit, and
   said expected value correction circuit corrects said expected value based on said error to obtain said corrected expected value, and outputs said corrected expected value to said Viterbi decoding circuit.

3. The optical disk apparatus according to claim 2, wherein said expected value includes a first expected value greater than a direct-current component of said reproduction signal, a second expected value located in a symmetrical position to said first expected value with respect to the direct-current component of said reproduction signal, and a third expected value equal to the direct-current component of said reproduction signal, and said expected value correction circuit corrects said first and second expected values, and outputs a first corrected expected value obtained by correcting said first expected value and a second corrected expected value obtained by correcting said second expected value to said Viterbi decoding circuit.

4. The optical disk apparatus according to claim 3, wherein said Viterbi decoding circuit calculates a first error between said first expected value and said sampling value, a second error between said second expected value and said sampling value and a third error between said third expected value and said sampling value to output to said expected value correction circuit, and said expected value correction circuit includes a signal generating circuit detecting a smallest error from among absolute values of said first, second and third errors, and generating, when the detected error is said first error, a first extract signal for extracting the sampling values corresponding to a region where said first error holds a minimal value, and generating, when said detected error is said second error, a second extract signal for extracting the sampling values corresponding to a region where said second error holds a minimal value, an averaging circuit extracting the sampling values in said region where said variation is small based on said first or second extract signal, and calculating an average value of the extracted sampling values, and an expected value operation circuit determining said first corrected expected value based on the average value from said averaging circuit, and calculating said second corrected expected value based on said first corrected expected value and said third expected value.

5. The optical disk apparatus according to claim 4, wherein said signal generating circuit includes a select signal generating circuit calculating a difference between said third error at a first timing and said third error at a second timing that is one cycle former than said first timing, and generating an error select signal having an activated level when the difference is smaller than a reference value and having an inactivated level when said difference is greater than the reference value, an absolute value operation circuit calculating absolute values of said first, second and third errors, a minimal error determination circuit detecting a minimal value from among the three absolute values calculated by said absolute value operation circuit, and generating, when the detected minimal value is the absolute value of said first error, a first error minimal signal having an activated level corresponding to a time period where said first error holds a minimal value, and generating, when said detected minimal value is the absolute value of said second error, a second error minimal signal having an activated level corresponding to a time period where said second error holds a minimal value, and an AND gate carrying out logical AND of said first or second error minimal signal and said error select signal to generate said first or second extract signal, and said averaging circuit latches said third error in synchronization with an activated level of said first or second extract signal, and calculates an average of the average value of said third error at said first timing and said third error at said second timing.

6. The optical disk apparatus according to claim 3, wherein said Viterbi decoding circuit calculates a first error between said first expected value and said sampling value, a second error between said second expected value and said sampling value, and a third error between said third expected value and said sampling value to output to said expected value correction circuit, and said expected value correction circuit includes a signal generating circuit detecting a smallest error from among absolute values of said first, second and third errors, and generating, when the detected error is said first error, a first extract signal for extracting the sampling values corresponding to a central portion of a region where said first error holds a minimal value, and generating, when said detected error is said second error, a second extract signal for extracting the sampling values corresponding to a central portion of a region where said second error holds a minimal value, an averaging circuit extracting said sampling values based on said first or second extract signal, and calculating an average value of the extracted sampling values, and an expected value operation circuit determining said first corrected expected value based on the average value from said averaging circuit, and calculating said second corrected expected value based on said first corrected expected value and said third expected value.

7. The optical disk apparatus according to claim 6, wherein said signal generating circuit includes an absolute value operation circuit calculating absolute values of said first, second and third errors, a minimal error determination circuit detecting a minimal value from among the three absolute values calculated by said absolute value operation circuit, and generating, when the detected minimal value is the absolute value of said first error, a first error minimal signal having an activated level corresponding to a time period where said first error holds a minimal value, and generating, when said detected minimal value is the absolute value of said second error, a second error minimal signal having an activated level corresponding to a time period where said second error holds a minimal value, and an AND gate generating said first extract signal by carrying out logical AND of said first error minimal signal, a first delayed error minimal signal having said first error minimal signal delayed by a prescribed amount of said reference clock and a second delayed error minimal signal having the first delayed error minimal signal delayed by said prescribed amount, and generating said second extract signal by carrying out logical AND of said second error minimal signal, a third delayed error minimal signal having said second error minimal signal delayed by said prescribed amount of said reference clock and a fourth delayed error minimal signal having the third delayed error minimal signal delayed by said prescribed amount, and said averaging circuit latches said third error in synchronization with an activated level of said first or second extract signal, and calculates an average of the average value of said third error at said first timing and said third error at said second timing.

8. The optical disk apparatus according to claim 3, wherein said Viterbi decoding circuit calculates a first error between said first expected value and said sampling value, a second error between said second expected value and said sampling value, and a third error between said third expected value and said sampling value to output to said expected value correction circuit, and said expected value correction circuit includes a signal generating circuit detecting a smallest error from among said first, second and third errors, and generating, when the detected error is said first error, a first extract signal for extracting said first errors, and generating, when said detected error is said second error, a second extract signal for extracting said second errors, an averaging circuit extracting said first or second errors based on said first or second extract signal, and calculating an average value of the extracted errors, and an expected value operation circuit determining said first or second corrected expected value based on a reference expected value added with the average value of said errors.

9. The optical disk apparatus according to claim 8, wherein said signal generating circuit includes a minimal error determination circuit detecting a minimal value from among said first, second and third errors, and generating, when the detected minimal value is said first error, a first error minimal signal having an activated level corresponding to a time period where said first error holds a minimal value and a first select signal for selecting said first error, and generating, when said detected minimal value is said second error, a second error minimal signal having an activated level corresponding to a time period where said second error holds a minimal value and a second select signal for selecting said second error, a select circuit selecting said first or second error based on said first and second select signals, a select signal generating circuit receiving the error selected by said select circuit and calculating a difference between said error at said first timing and said error at said second timing, and generating an error select signal having an activated level when the difference is smaller than a reference value and having an inactivated level when said difference is greater than the reference value, and an AND gate carrying out logical AND between said first or second error minimal signal and said error select signal to generate said first or second extract signal, and said averaging circuit latches the error selected by said select circuit in a time period where said first or second extract signal is at an activated level, and calculates an average of the average value of said error at said first timing and said error at said second timing.

10. The optical disk apparatus according to claim 3, wherein said Viterbi decoding circuit calculates a first error between said first expected value and said sampling value, a second error between said second expected value and said sampling value and a third error between said third expected value and said sampling value to output to said expected value correction circuit, and said expected value correction circuit includes a signal generating circuit detecting a smallest error from among said first, second and third errors, and generating, when the detected error is said first error, a first extract signal for extracting a central portion of a region where said first error holds a minimal value, and generating, when said detected error is said second error, a second extract signal for extracting a central portion of a region where said second error holds a minimal value, an averaging circuit extracting said first or second errors corresponding to said central portion based on said first or second extract signal and calculating an average value of the extracted errors, and an expected value operation circuit determining said first or second corrected expected value based on a reference expected value added with the average value of said errors.

11. The optical disk apparatus according to claim 10, wherein said signal generating circuit includes a minimal error determination circuit detecting a minimal value from among said first, second and third errors, and generating, when the detected minimal value is said first error, a first error minimal signal having an activated level corresponding to a time period where said first error holds a minimal value, and generating, when said detected minimal value is said second error, a second error minimal signal having an activated level corresponding to a time period where said second error holds a minimal value, and an AND gate carrying out logical AND of said first error minimal signal, a first delayed error minimal signal having said first error minimal signal delayed by a prescribed amount of said reference clock and a second delayed error minimal signal having the first delayed error minimal signal delayed by said prescribed amount to generate said first extract signal, and carrying out logical AND of said second error minimal signal, a third delayed error minimal signal having said second error minimal signal delayed by said prescribed amount of said reference clock and a fourth delayed error minimal signal having the third delayed error minimal signal delayed by said prescribed amount to generate said second extract signal, and said averaging circuit latches said first or second error in synchronization with an activated level of said first or second extract signal, and calculates an average of the average value of said first or second error at said first timing and said first or second error at said second timing.

12. The optical disk apparatus according to claim 2, wherein said expected value includes a first expected value greater than a direct-current component of said reproduction signal, a second expected value located in a symmetrical position to said first expected value with respect to the direct-current component of said reproduction signal, and a third expected value equal to the direct-current component of said reproduction signal, and said expected value correction circuit corrects said first, second and third expected values, and outputs to said Viterbi decoding circuit a first corrected expected value obtained by correcting said first expected value, a second corrected expected value obtained by correcting said second expected value and a third corrected expected value obtained by correcting said third expected value.

13. The optical disk apparatus according to claim 12, wherein said Viterbi decoding circuit calculates a first error between said first expected value and said sampling value, a second error between said second expected value and said sampling value and a third error between said third expected value and said sampling value to output to said expected value correction circuit, and said expected value correction circuit includes a signal generating circuit detecting a smallest error from among absolute values of said first, second and third errors, and generating, when the detected error is said first error, a first extract signal for extracting the third errors in a region where said first error holds a minimal value, generating, when said detected error is said second error, a second extract signal for extracting the third errors in a region where said second error holds a minimal value, and generating, when said detected error is said third error, a third extract signal for extracting the smallest third errors, a first averaging circuit extracting said third errors based on said first extract signal and calculating an average value of the extracted errors, a second averaging circuit extracting said third errors based on said second extract signal and calculating an average value of the extracted errors, a third averaging circuit extracting said third errors based on said third extract signal and calculating an average value of the extracted errors, and an expected value operation circuit determining said first corrected expected value based on a first error average value output from said first averaging circuit, determining said second corrected expected value based on a second error average value output from said second averaging circuit, and determining said third corrected expected value based on a third error average value output from said third averaging circuit.

14. The optical disk apparatus according to claim 13, wherein said signal generating circuit includes a select signal generating circuit calculating a difference between said third error at said first timing and said third error at said second timing, and generating an error select signal having an activated level when the difference is smaller than a reference value and having an inactivated level when said difference is greater than the reference value, an absolute value operation circuit calculating absolute values of said first, second and third errors, a minimal error determination circuit detecting a minimal value from among the three absolute values calculated by said absolute value operation circuit, and generating, when the detected minimal value is the absolute value of said first error, a first error minimal signal having an activated level corresponding to a time period where said first error holds a minimal value, generating, when said detected minimal value is the absolute value of said second error, a second error minimal signal having, an activated level corresponding to a time period where said second error holds a minimal value, and generating, when said detected minimal value is the absolute value of said third error, a third error minimal signal having an activated level corresponding to a time period where said third error holds a minimal value, a first AND gate carrying out logical AND of said first error minimal signal and said error select signal to generate said first extract signal, a second AND gate carrying out logical AND of said second error minimal signal and said error select signal to generate said second extract signal, and a third AND gate carrying out logical AND of said third error minimal signal and said error select signal to generate said third extract signal, said first averaging circuit latches said third error in synchronization with an activated level of said first extract signal, and calculates an average of the average value of said third error at said first timing and said third error at said second timing, said second averaging circuit latches said third error in synchronization with an activated level of said second extract signal, and calculates an average of the average value of said third error at said first timing and said third error at said second timing, and said third averaging circuit latches said third error in synchronization with an activated level of said third extract signal, and calculates an average of the average value of said third error at said first timing and said third error at said second timing.

15. The optical disk apparatus according to claim 12, wherein said Viterbi decoding circuit calculates a first error between said first expected value and said sampling value, a second error between said second expected value and said sampling value, and a third error between said third expected value and said sampling value, and outputs said first, second and third errors to said expected value correction circuit, and said expected value correction circuit includes a signal generating circuit detecting a smallest error from among absolute values of said first, second and third errors, and generating, when the detected error is said first error, a first extract signal for extracting a central portion of a region where said first error holds a minimal value, generating, when said detected error is said second error, a second extract signal for extracting a central portion of a region where said second error holds a minimal value, and generating, when said detected error is said third error, a third extract signal for extracting a central portion of a region where said third error holds a minimal value, a first averaging circuit extracting said third errors corresponding to said central portion based on said first extract signal, and calculating an average value of the extracted errors, a second averaging circuit extracting said third errors corresponding to said central portion based on said second extract signal, and calculating an average value of the extracted errors, a third averaging circuit extracting said third errors corresponding to said central portion based on said third extract signal, and calculating an average value of the extracted errors, and an expected value operation circuit determining said first corrected expected value based on a first error average value output from said first averaging circuit, determining said second corrected expected value based on a second error average value output from said second averaging circuit, and determining said third corrected expected value based on a third error average value output from said third averaging circuit.

16. The optical disk apparatus according to claim 15, wherein said signal generating circuit includes an absolute value operation circuit calculating absolute values of said first, second and third errors, a minimal error determination circuit detecting a minimal value from the three absolute values calculated by said absolute value operation circuit, and generating, when the detected minimal value is the absolute value of said first error, a first error minimal signal having an activated level corresponding to a time period where said first error holds a minimal value, generating, when said detected minimal value is the absolute value of said second error, a second error minimal signal having an activated level corresponding to a time period where said second error holds a minimal value, and generating, when said detected minimal value is the absolute value of said third error, a third error minimal signal having an activated level corresponding to a time period where said third error holds a minimal value, a first AND gate carrying out logical AND of said first error minimal signal, a first delayed error minimal signal having said first error minimal signal delayed by a prescribed amount of said reference clock and a second delayed error minimal signal having the first delayed error minimal signal delayed by said prescribed amount to generate said first extract signal, a second AND gate carrying out logical AND of said second error minimal signal, a third delayed error minimal signal having said second error minimal signal delayed by said prescribed amount of said reference clock and a fourth delayed error minimal signal having the third delayed error minimal signal delayed by said prescribed amount to generate said second extract signal, and a third AND gate carrying out logical AND of said third error minimal signal, a fifth delayed error minimal signal having said third error minimal signal delayed by said prescribed amount of said reference clock and a sixth delayed error minimal signal having the fifth delayed error minimal signal delayed by said prescribed amount to generate said third extract signal, said first averaging circuit latches said third error in synchronization with an activated level of said first extract signal, and calculates an average of the average value of said third error at said first timing and said third error at said second timing, said second averaging circuit latches said third error in synchronization with an activated level of said second extract signal, and calculates an average of the average value of said third error at said first timing and said third error at said second timing, and said third averaging circuit latches said third error in synchronization with an activated level of said third extract signal, and calculates an average of the average value of said third error at said first timing and said third error at said second timing.

17. The optical disk apparatus according to claim 12, wherein said Viterbi decoding circuit calculates a first error between said first expected value and said sampling value, a second error between said second expected value and said sampling value and a third error between said third expected value and said sampling value to output to said expected value correction circuit, and said expected value correction circuit includes a signal generating circuit detecting a smallest error from among absolute values of said first, second and third errors, and generating, when the detected error is said first error, a first extract signal for extracting said first errors, generating, when said detected error is said second error, a second extract signal for extracting said second errors, and generating, when said detected error is said third error, a third extract signal for extracting said third errors, a first averaging circuit extracting said first errors based on said first extract signal, and calculating an average value of the extracted errors, a second averaging circuit extracting said second errors based on said second extract signal, and calculating an average value of the extracted errors, a third averaging circuit extracting said third errors based on said third extract signal, and calculating an average value of the extracted errors, and an expected value operation circuit determining said first corrected expected value based on a first reference expected value added with a first error average value output from said first averaging circuit, determining said second corrected expected value based on a second reference expected value added with a second error average value output from said second averaging circuit, and determining said third corrected expected value based on a third reference expected value added with a third error average value output from said third averaging circuit.

18. The optical disk apparatus according to claim 17, wherein said signal generating circuit includes a minimal error determination circuit detecting a minimal value from among said first, second and third errors, and generating, when the detected minimal value is said first error, a first error minimal signal having an activated level corresponding to a time period where said first error holds a minimal value and a first select signal for selecting said first error, generating, when said detected minimal value is said second error, a second error minimal signal having an activated level corresponding to a time period where said second error holds a minimal value and a second select signal for selecting said second error, and generating, when said detected minimal value is said third error, a third error minimal signal having an activated level corresponding to a time period where said third error holds a minimal value and a third select signal for selecting said third error, a select circuit selecting said first, second and third errors based on said first, second and third select signals, respectively, a select signal generating circuit receiving the error selected by said select circuit and calculating a difference between said error at said first timing and said error at said second timing, and generating an error select signal having an activated level when the difference is smaller than a reference value and an inactivated level when said difference is greater than the reference value, a first AND gate carrying out logical AND of said first error minimal signal and said error select signal to generate said first extract signal, a second AND gate carrying out logical AND of said second error minimal signal and said error select signal to generate said second extract signal, and a third AND gate carrying out logical AND of said third error minimal signal and said error select signal to generate said third extract signal, said first averaging circuit latches said first error in synchronization with an activated level of said first extract signal, and calculates an average of the average value of said first error at said first timing and said first error at said second timing to output said first error average value, said second averaging circuit latches said second error in synchronization with an activated level of said second extract signal, and calculates an average of the average value of said second error at said first timing and said second error at said second timing to output said second error average value, and said third averaging circuit latches said third error in synchronization with an activated level of said third extract signal, and calculates an average of the average value of said third error at said first timing and said third error at said second timing to output said third error average value.

19. The optical disk apparatus according to claim 12, wherein said Viterbi decoding circuit calculates a first error between said first expected value and said sampling value, a second error between said second expected value and said sampling value and a third error between said third expected value and said sampling value to output to said expected value correction circuit, and said expected value correction circuit includes a signal generating circuit detecting a smallest error from among absolute values of said first, second and third errors, and generating, when the detected error is said first error, a first extract signal for extracting a central portion of a region where said first error holds a minimal value, generating, when said detected error is said second error, a second extract signal for extracting a central portion of a region where said second error holds a minimal value, and generating, when said detected error is said third error, a third extract signal for extracting a central portion of a region where said third error holds a minimal value, a first averaging circuit extracting said first errors corresponding to said central portion based on said first extract signal, and calculating an average value of the extracted errors, a second averaging circuit extracting said second errors corresponding to said central portion based on said second extract signal, and calculating an average value of the extracted errors, a third averaging circuit extracting said third errors corresponding to said central portion based on said third extract signal, and calculating an average value of the extracted errors, and an expected value operation circuit determining said first corrected expected value based on a first reference expected value added with a first error average value output from said first averaging circuit, determining said second corrected expected value based on a second reference expected value added with a second error average value output from said second averaging circuit, and determining said third corrected expected value based on a third reference expected value added with a third error average value output from said third averaging circuit.

20. The optical disk apparatus according to claim 19, wherein said signal generating circuit includes a minimal error determination circuit detecting a minimal value from among said first, second and third errors, and generating, when the detected minimal value is said first error, a first error minimal signal having an activated level corresponding to a time period where said first error holds a minimal value, generating, when said detected minimal value is said second error, a second error minimal signal having an activated level corresponding to a time period where said second error holds a minimal value, and generating, when said detected minimal value is said third error, a third error minimal signal having an activated level corresponding to a time period where said third error holds a minimal value, a first AND gate carrying out logical AND of said first error minimal signal, a first delayed error minimal signal having said first error minimal signal delayed by a prescribed amount of said reference clock and a second delayed error minimal signal having the first delayed error minimal signal delayed by said prescribed amount to generate said first extract signal, a second AND gate carrying out logical AND of said second error minimal signal, a third delayed error minimal signal having said second error minimal signal delayed by said prescribed amount of said reference clock and a fourth delayed error minimal signal having the third delayed error minimal signal delayed by said prescribed amount to generate said second extract signal, and a third AND gate carrying out logical AND of said third error minimal signal, a fifth delayed error minimal signal having said third error minimal signal delayed by said prescribed amount of said reference clock and a sixth delayed error minimal signal having the fifth delayed error minimal signal delayed by said prescribed amount to generate said third extract signal, said first averaging circuit latches said first error in synchronization with an activated level of said first extract signal, and calculates an average of the average value of said first error at said first timing and said first error at said second timing to output said first error averaging value, said second averaging circuit latches said second error in synchronization with an activated level of said second extract signal, and calculates an average of the average value of said second error at said first timing and said second error at said second timing to output said second error average value, and said third averaging circuit latches said third error in synchronization with an activated level of said third extract signal, and calculates an average of the average value of said third error at said first timing and said third error at said second timing to output said third error average value.

* * * * *